(12) United States Patent
Watanabe et al.

(10) Patent No.: US 11,616,005 B2
(45) Date of Patent: Mar. 28, 2023

(54) PLURALITY OF LEADS HAVING A TWO STAGE RECESS

(71) Applicant: SHINKO ELECTRIC INDUSTRIES CO., LTD., Nagano (JP)

(72) Inventors: Koji Watanabe, Nagano (JP); Kentaro Kaneko, Nagano (JP); Hiroto Seki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/165,032

(22) Filed: Feb. 2, 2021

(65) Prior Publication Data
US 2021/0249340 A1 Aug. 12, 2021

(30) Foreign Application Priority Data
Feb. 6, 2020 (JP) .............................. JP2020-019203

(51) Int. Cl.
*H01L 23/495* (2006.01)
*H01L 21/48* (2006.01)
*H01L 21/56* (2006.01)
*H01L 21/78* (2006.01)
*H01L 23/31* (2006.01)

(52) U.S. Cl.
CPC .... *H01L 23/49548* (2013.01); *H01L 21/4825* (2013.01); *H01L 21/4828* (2013.01); *H01L 21/565* (2013.01); *H01L 21/568* (2013.01); *H01L 21/78* (2013.01); *H01L 23/3114* (2013.01); *H01L 23/4952* (2013.01); *H01L 23/49513* (2013.01); *H01L 23/49541* (2013.01); *H01L 2924/181* (2013.01)

(58) Field of Classification Search
CPC ..... H01L 24/48; H01L 24/49; H01L 21/4825; H01L 21/4828; H01L 21/565; H01L 21/568; H01L 21/78; H01L 23/49548; H01L 23/3114; H01L 23/49513; H01L 23/4952; H01L 23/49541; H01L 23/49503; H01L 23/49575
See application file for complete search history.

(56) References Cited

U.S. PATENT DOCUMENTS

| | | | |
|---|---|---|---|
| 6,608,366 B1 | 8/2003 | Fogelson et al. | |
| 2012/0313131 A1* | 12/2012 | Oda | H01L 33/56 257/E33.072 |
| 2016/0254214 A1* | 9/2016 | Makino | H01L 23/49582 257/676 |
| 2017/0213944 A1* | 7/2017 | Naka | H01L 33/60 |
| 2018/0240739 A1* | 8/2018 | Kaneko | H01L 21/4828 |
| 2020/0176649 A1* | 6/2020 | Tanaka | H01L 33/54 |

FOREIGN PATENT DOCUMENTS

JP 2014-011457 1/2014

* cited by examiner

*Primary Examiner* — Alonzo Chambliss
(74) *Attorney, Agent, or Firm* — Rankin, Hill & Clark LLP

(57) ABSTRACT

A lead frame includes: a frame body; a plurality of leads individually projecting from the frame body; and a recess formed across one surfaces of the leads adjacent to each other with the frame body therebetween, the recess including a first recess, and a second recess partially overlapping the first recess in a bottom surface thereof and having a smaller depth than the first recess.

5 Claims, 30 Drawing Sheets

PLURALITY OF LEADS HAVING A TWO STAGE RECESS

CROSS-REFERENCE TO RELATED APPLICATION

This application is based upon and claims the benefit of priority of the prior Japanese Patent Application No. 2020-019203, filed on Feb. 6, 2020, the entire contents of which are incorporated herein by reference.

FIELD

The embodiment discussed herein is related to a lead frame, a semiconductor package, and a method for manufacturing a lead frame.

BACKGROUND

Quad flat non-leaded (QFN) semiconductor packages have been known as thin semiconductor packages. In the QFN semiconductor packages, a semiconductor device mounted on a mounting surface of a lead frame is encapsulated by encapsulating resin, and a lead is partially exposed from a back surface opposite to the mounting surface.

In a manufacturing process for such a QFN semiconductor package, first, etching is performed on a metal plate, obtaining a lead frame in which areas individually corresponding to semiconductor devices are arranged in a matrix. In the lead frame, the areas individually corresponding to semiconductor devices are partitioned by a frame body. A plurality of leads are individually connected to the frame body. The frame body is also called a "connecting bar". In the lead frame, a recess is also formed across one surfaces of the leads adjacent to each other with the frame body therebetween. Subsequently, in the manufacturing process for the QFN semiconductor package, semiconductor devices are mounted on the lead frame. Molding is then performed to encapsulate the leads and the semiconductor devices by using encapsulating resin. After that, the semiconductor devices are separated from each other by performing sawing by a saw blade capable of cutting a cut range including the frame body of the lead frame.

When the cut range including the frame body of the lead frame is cut by the saw blade, a side end of each lead is exposed from the encapsulating resin, and the recess is cut at the side end of each lead. The cut recess serves to facilitate solder wet-spreading at the side end of each lead in mounting the semiconductor package on a mounting substrate by soldering. The recess thereby forms a solder fillet at the side end of each lead. As a result, the semiconductor package is firmly bonded to the mounting substrate (U.S. Pat. No. 6,608,366, Japanese Patent Application Laid-open No. 2014-11457).

Unfortunately, when the range including the frame body of the lead frame is cut by the saw blade, saw debris generated from the frame body or the like sometimes adheres to the recess at the side end of each lead exposed from the encapsulating resin. The saw debris adhering to the recess restricts the solder wet-spreading in the recess, making it difficult to form the solder fillet in mounting the semiconductor package on the mounting substrate. This can damage connection reliability between the semiconductor package and the mounting substrate or reduce solder visibility by the fillet.

To solve the problems, the influence by the adhesion of the saw debris may be reduced by increasing the depth of the recess. For example, when the recess is formed across one surfaces of the adjacent leads with the frame body therebetween in the lead frame, the depth of the entire recess from the one surfaces of the leads may be increased to half or more of the thickness of the leads. However, as the entire recess is deeper, the entire thickness of the leads at the recess is decreased, making it difficult to ensure the strength of the leads. As a result, the leads may be deformed at the recess.

SUMMARY

According to an aspect of an embodiment, a lead frame includes a frame body; a plurality of leads individually projecting from the frame body; and a recess formed across one surfaces of the leads adjacent to each other with the frame body therebetween, wherein the recess includes a first recess, and a second recess partially overlapping the first recess in a bottom surface thereof and having a smaller depth than the first recess.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of a lead frame, a semiconductor package, and a method for manufacturing a lead frame disclosed in the present application will be described in detail based on the drawings. Note that the embodiment is not intended to limit the disclosed technique.

Embodiment

Configuration of Lead Frame

Figure 1:
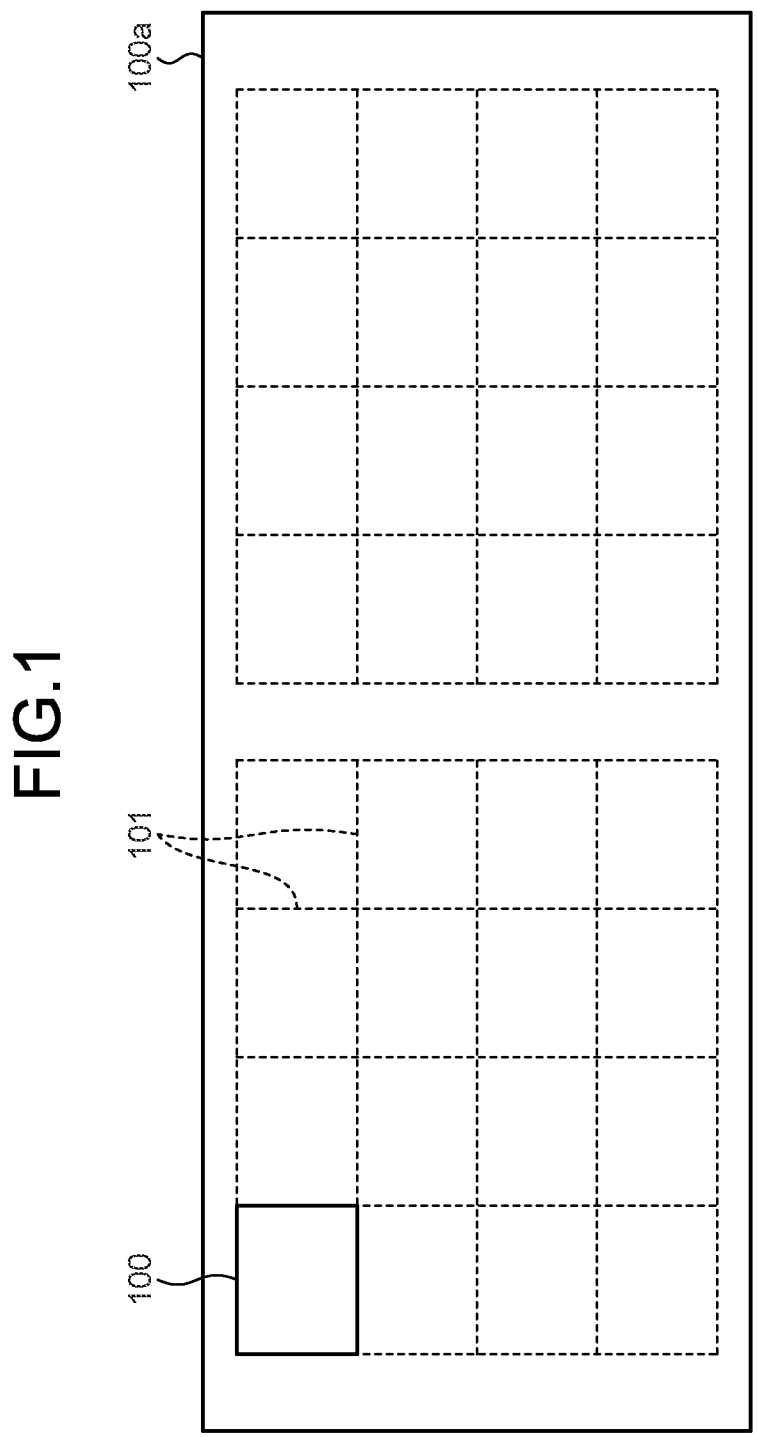
FIG. 1 is a plan view illustrating a configuration example of a lead frame according to an embodiment.

FIG. 1 is a plan view illustrating a configuration example of a lead frame 100a according to the embodiment. As illustrated in FIG. 1, the lead frame 100a is a conductive member made of metal such as copper or copper alloy. The lead frame 100a is formed as an aggregate in which a single lead frame 100 is disposed in each of a plurality of sections divided in a matrix by a frame body 101. The single lead frame 100 is an element to be separated as an individual semiconductor package after mounting a semiconductor device thereon. In the following description, the single lead frame 100 is appropriately referred to as a "lead frame 100".

Figure 2:
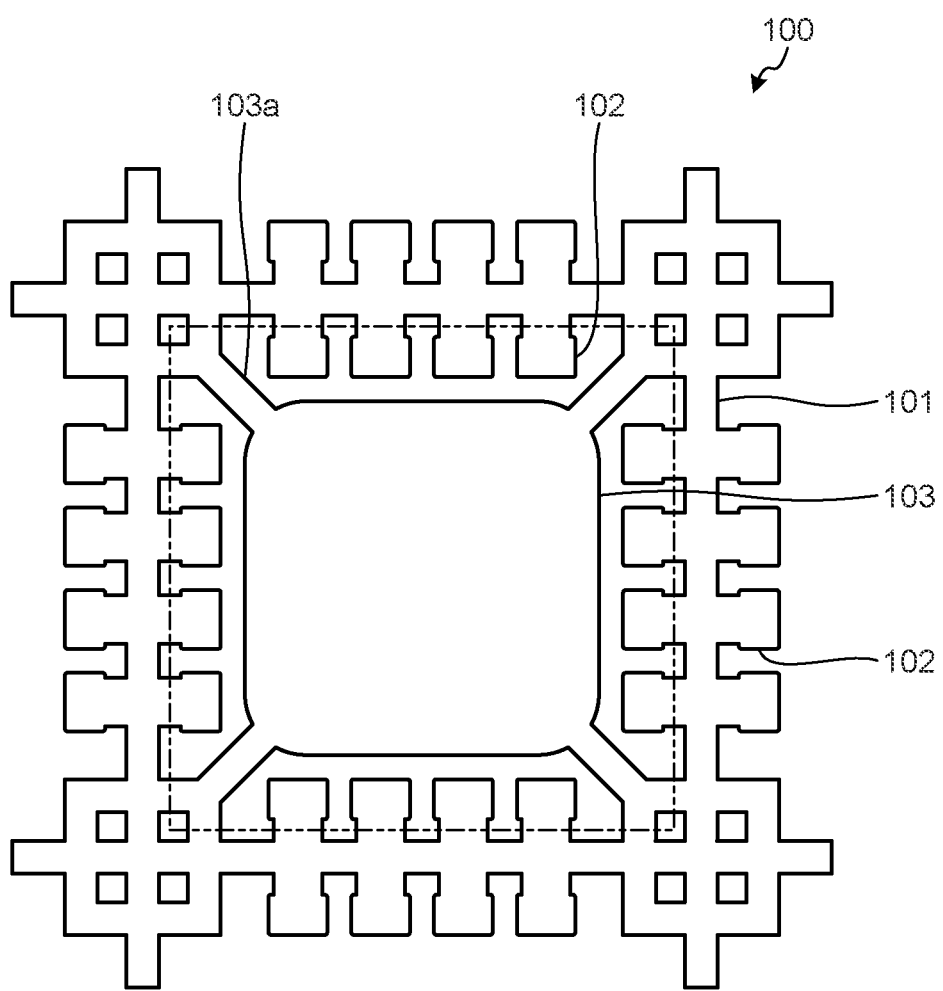
FIG. 2 is a plan view of the lead frame as viewed from its upper surface.
Figure 3:
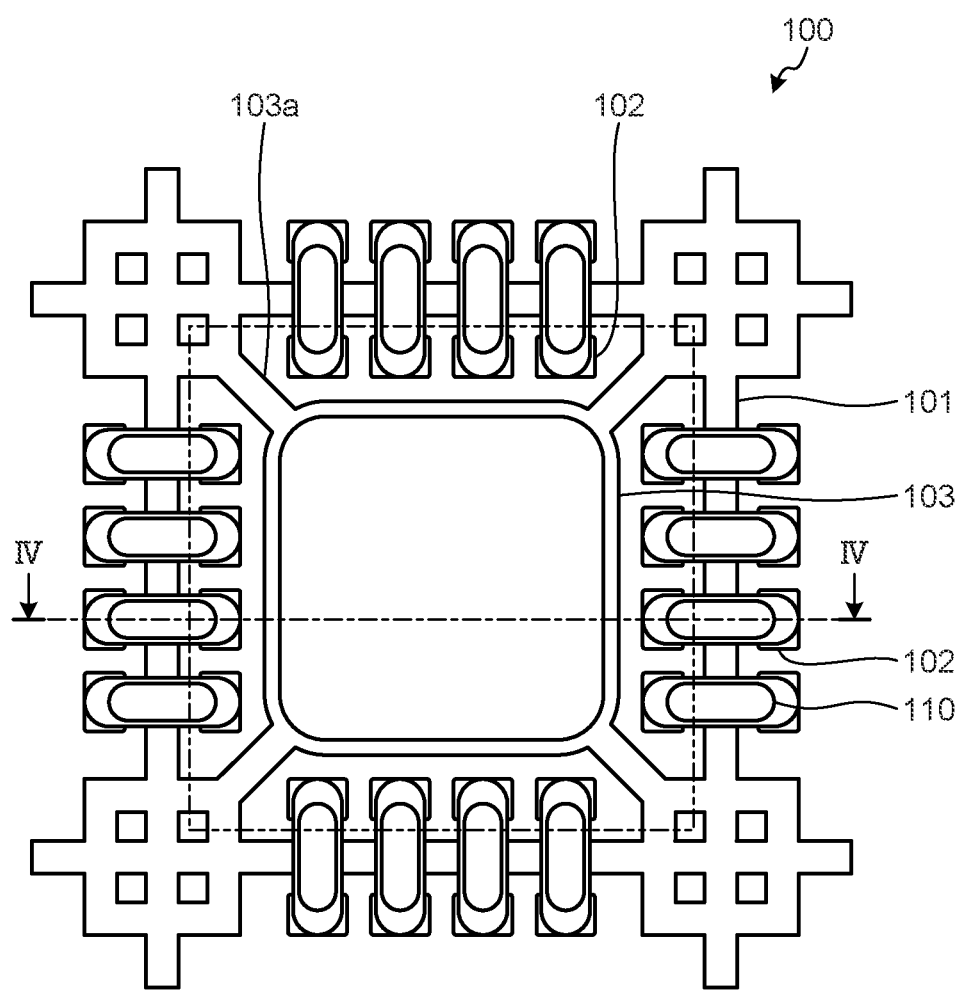
FIG. 3 is a plan view of the lead frame as viewed from its lower surface.

FIG. 2 is a plan view of the lead frame 100 as viewed from its upper surface. FIG. 3 is a plan view of the lead frame 100 as viewed from its lower surface. In the following description, a surface placed on the semiconductor device side in mounting the semiconductor device on the lead frame 100 is referred to as an "upper surface", and a surface placed on an opposite side from the semiconductor device as a "lower surface". A vertical direction is defined correspondingly.

Note that the lead frame 100 may be manufactured and used in any orientation, such as upside down.

The lead frame 100 in FIGS. 2 and 3 includes the frame body 101, a plurality of leads 102, and a die pad 103. The frame body 101 provides a plurality of sections divided in a matrix. The single lead frame 100 is disposed in each section provided by the frame body 101. Each section provided by the frame body 101 is referred to as a "unit section" below. The unit section is shown as a section enclosed by a two-dot chain line in FIGS. 2 and 3. Two lead frames 100 individually disposed in two adjacent unit sections are separated from each other by performing sawing by a saw blade capable of cutting a cut range including the frame body 101.

The leads 102 individually project toward the inside of the corresponding unit section from the frame body 101. A distal end of each lead 102 is wider than a proximal end thereof. An upper surface of each lead 102 serves as an internal terminal to be connected to a connection member connecting the lead 102 and the semiconductor device. Meanwhile, a lower surface of each lead 102 serves as an external terminal to be connected to an unillustrated mounting substrate.

The die pad 103 has a quadrangular shape and is supported by being connected to the surrounding frame body 101 by a support lead 103a. A mounting surface for mounting the semiconductor device thereon is formed on an upper surface of the die pad 103. A stepped surface recessed toward the upper surface of the lead frame 100 is formed along the outer periphery of a lower surface of the die pad 103.

Figure 4:
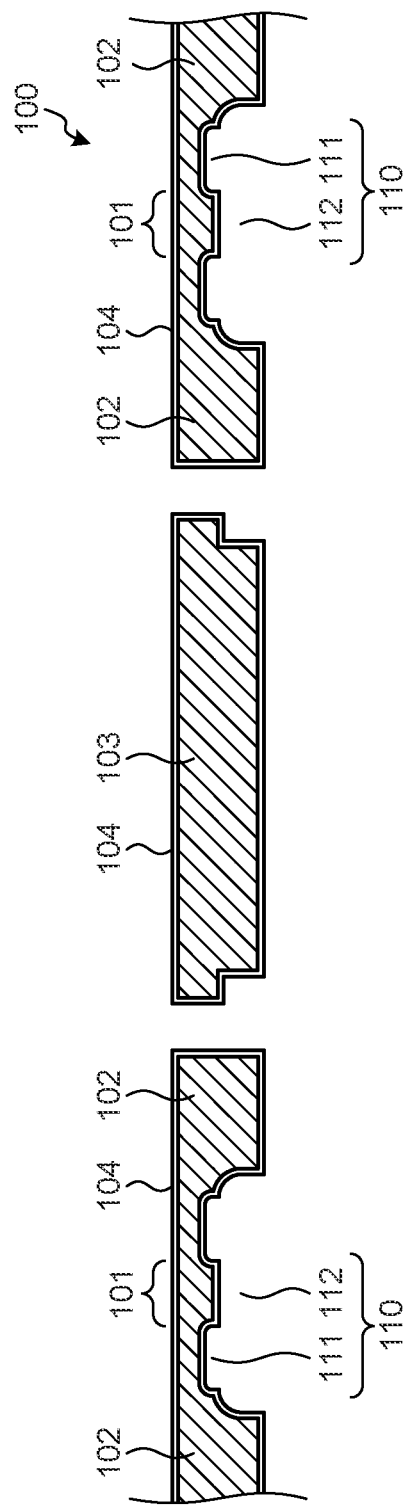
FIG. 4 is a cross sectional view taken along a line IV-IV in FIG. 3.

FIG. 4 is a cross sectional view taken along a line IV-IV in FIG. 3. The lead frame 100 has a plurality of pairs of the leads 102 projecting in an opposite direction with the frame body 101 therebetween as illustrated in FIG. 4. A recess 110 is formed in the lower surfaces of the leads 102 adjacent to each other with the frame body 101 therebetween. The recess 110 is formed across the lower surfaces of the adjacent leads 102 with the frame body 101 therebetween continuously in a longitudinal direction of the leads 102 from the frame body 101. That is, in each pair of adjacent leads 102 with the frame body 101 therebetween, the single recess 110 is formed continuously through the lower surface of one of the leads 102, a lower surface of the frame body 101, and the lower surface of the other of the leads 102.

The recess 110 has two-stage recesses 111 and 112. That is, the recess 110 has the recess 111 and the recess 112 overlapping the recess 111 in the bottom surface of the recess 111 and having a smaller depth from the lower surfaces of the leads 102 than the recess 111. In other words, the recess 110 has a relatively small depth from the lower surfaces of the leads 102 at the recess 112, and a locally large depth from the lower surfaces of the leads 102 at the recess 111. This mitigates a decrease in the entire thickness of the leads 102 at the recess 110, ensuring the strength of the leads 102. As a result, the leads 102 can be prevented from being deformed at the recess 110.

A plating layer 104 is formed on the surface of the lead frame 100 (i.e., the surfaces of the frame body 101, the leads 102, and the die pad 103). For example, a plating layer obtained by stacking nickel plating, palladium (Pd) plating, and gold plating in this order is used as the plating layer 104. The plating layer 104 is also formed inside of the recess 110. In the following description, the plating layer 104 is appropriately omitted.

Figure 5:
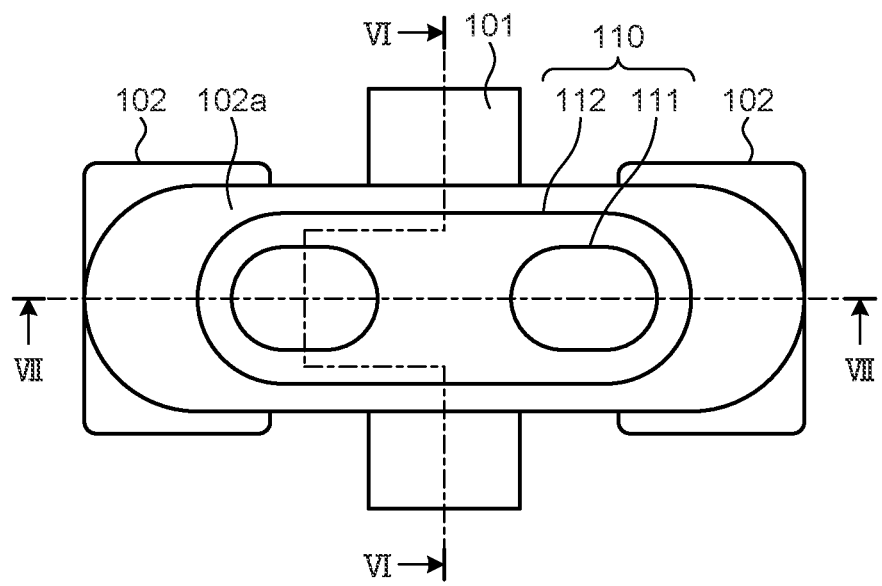
FIG. 5 is an enlarged view illustrating lower surfaces of leads adjacent to each other with a frame body therebetween.
Figure 6:
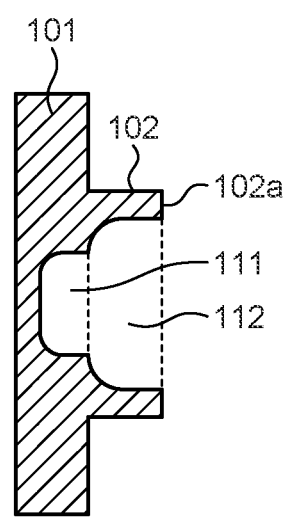
FIG. 6 is a cross sectional view taken along a line VI-VI in FIG. 5.
Figure 7:
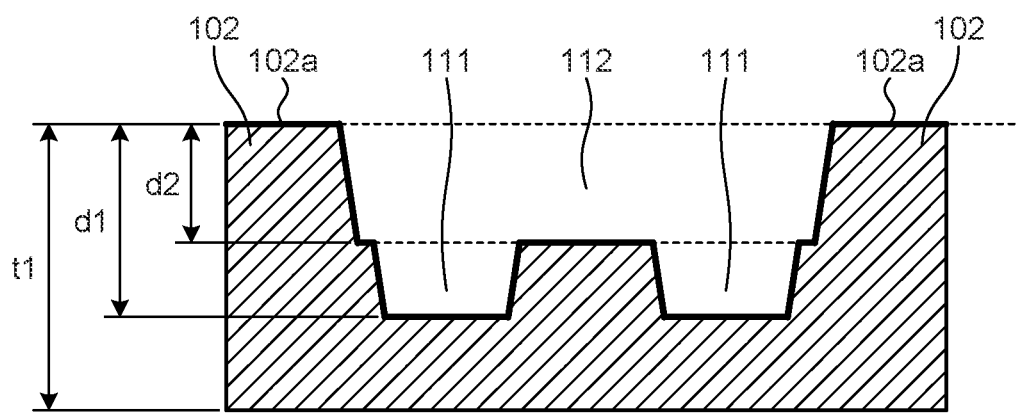
FIG. 7 is a cross sectional view taken along a line VII-VII in FIG. 5.

Referring now to FIGS. 5 to 7, the shape of the recess 110 will be more specifically described. FIG. 5 is an enlarged view illustrating the lower surfaces of the adjacent leads 102 with the frame body 101 therebetween. FIG. 6 is a cross sectional view taken along a line VI-VI in FIG. 5. FIG. 7 is a cross sectional view taken along a line VII-VII in FIG. 5. As described above, the recess 110 is formed across lower surfaces 102a of the adjacent leads 102 with the frame body 101 therebetween, and has the two-stage recesses 111 and 112 having different depths from the lower surfaces 102a of the leads 102. Additionally, the recess 110 has a pair of the recesses 111.

The pair of recesses 111 is arranged separately from each other within a range having at least the frame body 101 therebetween in the lower surfaces 102a of the leads 102. That is, the locally deep recesses 111 are separated within the range having the frame body 101 therebetween. Each recess 111 may partially overlap the frame body 101 as viewed from the lower surfaces 102a of the leads 102.

The depths of each recess 111 and the recess 112 are determined according to the thickness of the leads 102. That is, a depth d1 of each recess 111 from the lower surfaces 102a of the leads 102 is larger than a predetermined value determined according to a thickness t1 of the leads 102. A depth d2 of the recess 112 from the lower surfaces 102a of the leads 102 is smaller than the predetermined value determined according to the thickness t1 of the leads 102. For example, the depth d1 of each recess 111 is larger than the half of the thickness t1 of the leads 102, and the depth d2 of the recess 112 is smaller than the half of the thickness t1 of the leads 102. Each recess 111 increases a cross-sectional area of the recess 110 in a thickness direction of the leads 102. Thus, even when saw debris generated during cutting the cut range including the frame body 101 by the saw blade adheres to the recess 110, solder wet-spreading in the recess 110 is not restricted by the saw debris. Meanwhile, the relatively shallow recess 112 mitigates the decrease in the entire thickness of the leads 102, ensuring the strength of the leads 102 at the recess 110.

When the lead frame 100 is viewed in plan view from the lower surface, the recesses 111 and the recess 112 are disposed overlapping each other. Additionally, the recess 112 has a larger area than the recesses 111. The areas of the recesses 111 are included in the area of the recess 112.

A stepped surface is formed on the lower surface of the wide portion at the distal end of each lead 102 so as to be located closer to the upper surface of the lead frame 100 than the lower surface 102a. The stepped surface of the wide portion at the distal end of each lead 102 is formed flush with the lower surface of the frame body 101 and the bottom surface of the recess 112.

Additionally, the stepped surface along the outer periphery of the lower surface of the die pad 103, a lower surface of the support lead 103a, the stepped surface on the lower surface of the wide portion at the distal end of each lead 102, and the bottom surface of the recess 112 are formed flush with each other. These surfaces are formed simultaneously by etching at a step in FIG. 17 described later.

Configuration of Semiconductor Package

Figure 8:
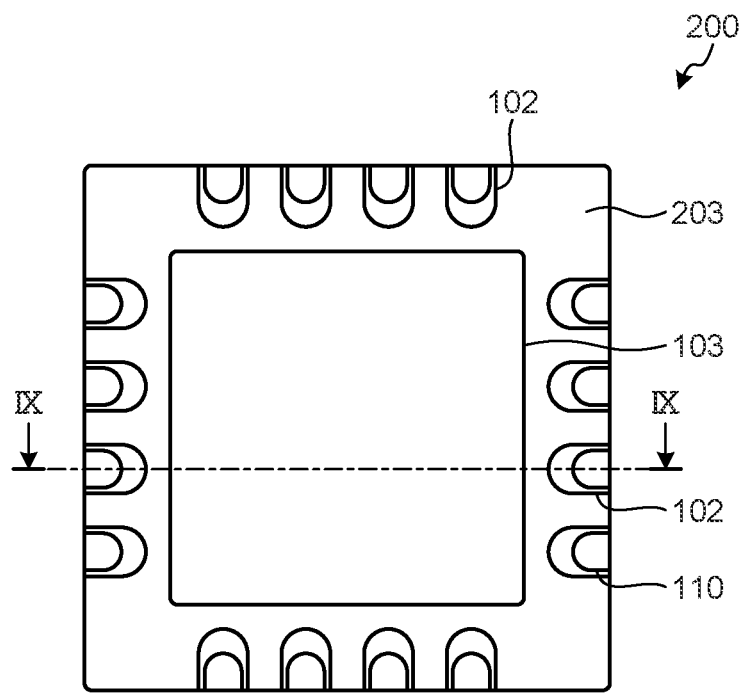
FIG. 8 is a plan view of a semiconductor package manufactured by using the lead frame according to the embodiment as viewed from its lower surface.
Figure 9:
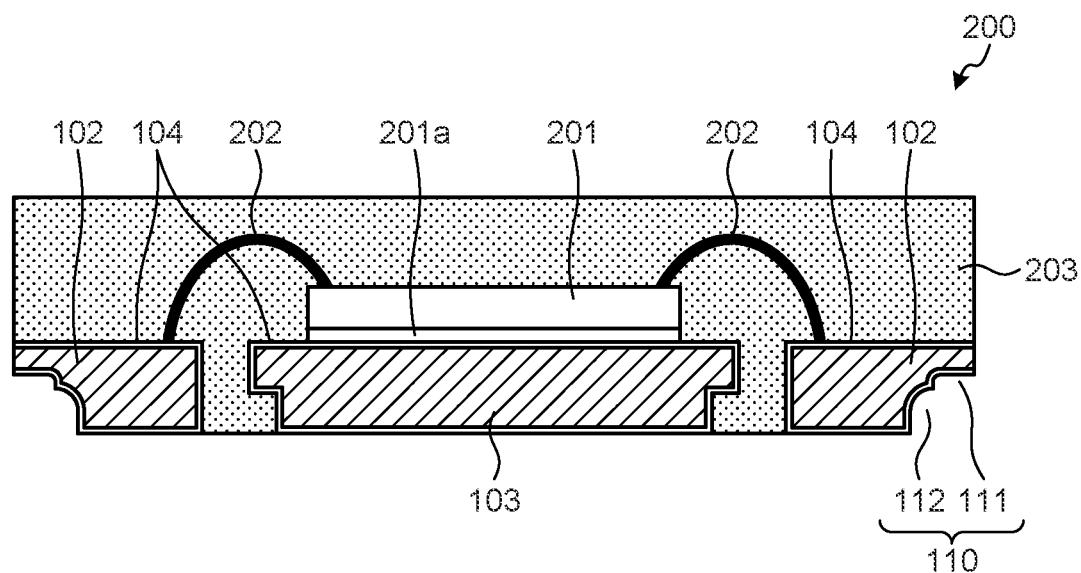
FIG. 9 is a cross sectional view taken along a line IX-IX in FIG. 8.

Next, a semiconductor package 200 manufactured by using the lead frame 100 according to the embodiment will be described by reference to FIGS. 8 and 9. FIG. 8 is a plan view of the semiconductor package 200 manufactured by using the lead frame 100 according to the embodiment as viewed from its lower surface. FIG. 9 is a cross sectional view taken along a line IX-IX in FIG. 8.

The semiconductor package 200 in FIGS. 8 and 9 includes the leads 102, the die pad 103, a semiconductor device 201 mounted on the upper surface of the die pad 103, and a encapsulating resin 203 that covers the leads 102, the die pad 103, and the semiconductor device 201. Among these elements, the leads 102 and the die pad 103 respectively correspond to the leads 102 and the die pad 103 placed in the unit section indicated by the two-dot chain line in FIGS. 2 and 3. The surfaces of the leads 102 and the die pad 103 are covered with the plating layer 104.

The semiconductor device 201 is an electronic component such as an integrated circuit, a large-scale integrated circuit, a transistor, a thyristor, and a diode. The semiconductor device 201 is bonded to the upper surface of the die pad 103 by an adhesive 201a such as a die bonding paste. When the adhesive 201a is a die bonding paste, a die bonding paste made of, for example, an epoxy resin or a silicone resin can be selected. The semiconductor device 201 is also electrically connected to the leads 102 via connection members 202. The connection members 202 are bonding wires made of a conductive material such as gold and copper.

The encapsulating resin 203 is an insulating resin such as an epoxy resin and a silicone resin. The leads 102 and the die pad 103 covered with the encapsulating resin 203 are partially exposed from the encapsulating resin 203. That is, the lower surfaces of the leads 102 and the die pad 103 are exposed from the encapsulating resin 203 on the lower surface of the semiconductor package 200. Side surfaces of the leads 102 are also partially exposed from the encapsulating resin 203 on a side surface of the semiconductor package 200. The recess 110 is formed at a side end of the lower surface of each lead 102.

The recess 110 has the two-stage recesses 111 and 112. That is, the recess 110 has the recess 111 and the recess 112 overlapping the recess 111 in the bottom surface of the recess 111 and having a smaller depth from the lower surface of each lead 102 than the recess 111. In other words, the recess 110 has a relatively small depth from the lower surface of each lead 102 at the recess 112, and a locally large depth from the lower surface of each lead 102 at the recess 111. This mitigates a decrease in the entire thickness of each lead 102 at the recess 110, ensuring the strength of each lead 102. As a result, each lead 102 can be prevented from being deformed at the recess 110.

Figure 10:
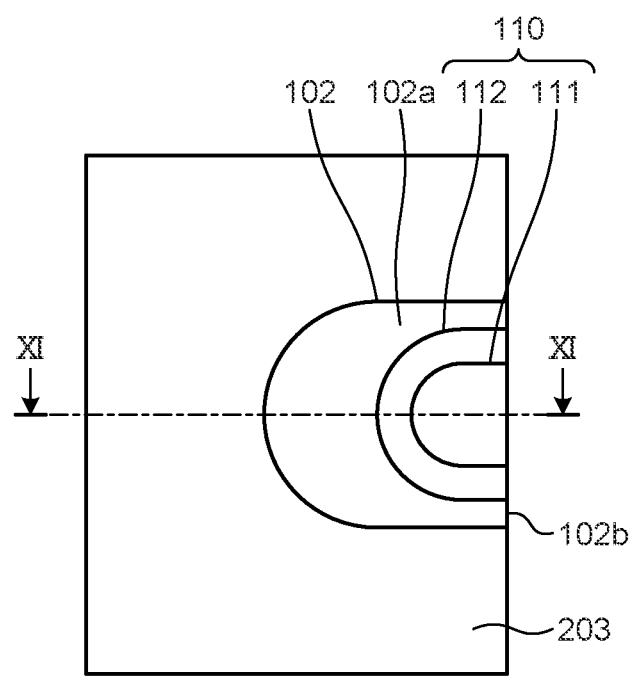
FIG. 10 is an enlarged view illustrating a side end of the lower surface of the lead.
Figure 11:
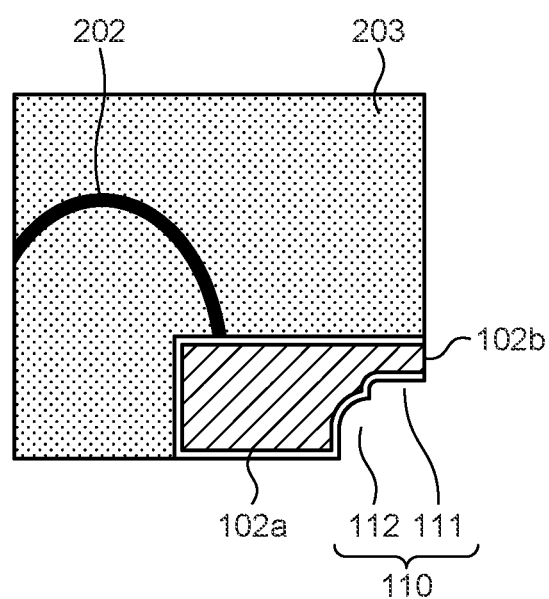
FIG. 11 is a cross sectional view taken along a line XI-XI in FIG. 10.

Referring now to FIGS. 10 and 11, the shape of the recess 110 will be more specifically described. FIG. 10 is an enlarged view illustrating the side end of the lower surface 102a of each lead 102. FIG. 11 is a cross sectional view taken along a line XI-XI in FIG. 10. As described above, the recess 110 is formed at the side end of the lower surface 102a of each lead 102, and has the two-stage recesses 111 and 112 having different depths from the lower surface 102a of each lead 102. The two-stage recesses 111 and 112 are open at a side surface 102b of each lead 102 exposed from the encapsulating resin 203. Two steps are thereby formed by the two-stage recesses 111 and 112 at the side end of the lower surface 102a of each lead 102. The two steps have depths equal to those of the recesses 111 and 112. Thus, the strength of each lead 102 at the recess 110 can be ensured without restricting the solder wet-spreading in the recess 110 by the saw debris.

Returning to FIGS. 8 and 9, the stepped surface (see FIG. 3) along the outer periphery of the lower surface of the die pad 103 is covered with the encapsulating resin 203 in the semiconductor package 200. Covering the stepped surface along the outer periphery of the lower surface of the die pad 103 with the encapsulating resin 203 allows prevention of falling of the die pad 103 from the encapsulating resin 203.

Additionally, the stepped surface (see FIG. 3) of the wide portion at the distal end of each lead 102 is covered with the encapsulating resin 203 in the semiconductor package 200. Thus, only the lower surface 102a of each lead 102 is exposed and the stepped surface is not exposed from a lower surface of the encapsulating resin 203 (i.e., the lower surface of the semiconductor package 200) (see FIGS. 8 and 10). Covering the stepped surface of the wide portion at the distal end of each lead 102 with the encapsulating resin 203 allows prevention of falling of each lead 102 from the encapsulating resin 203.

Method for Manufacturing Lead Frame

Figure 12:
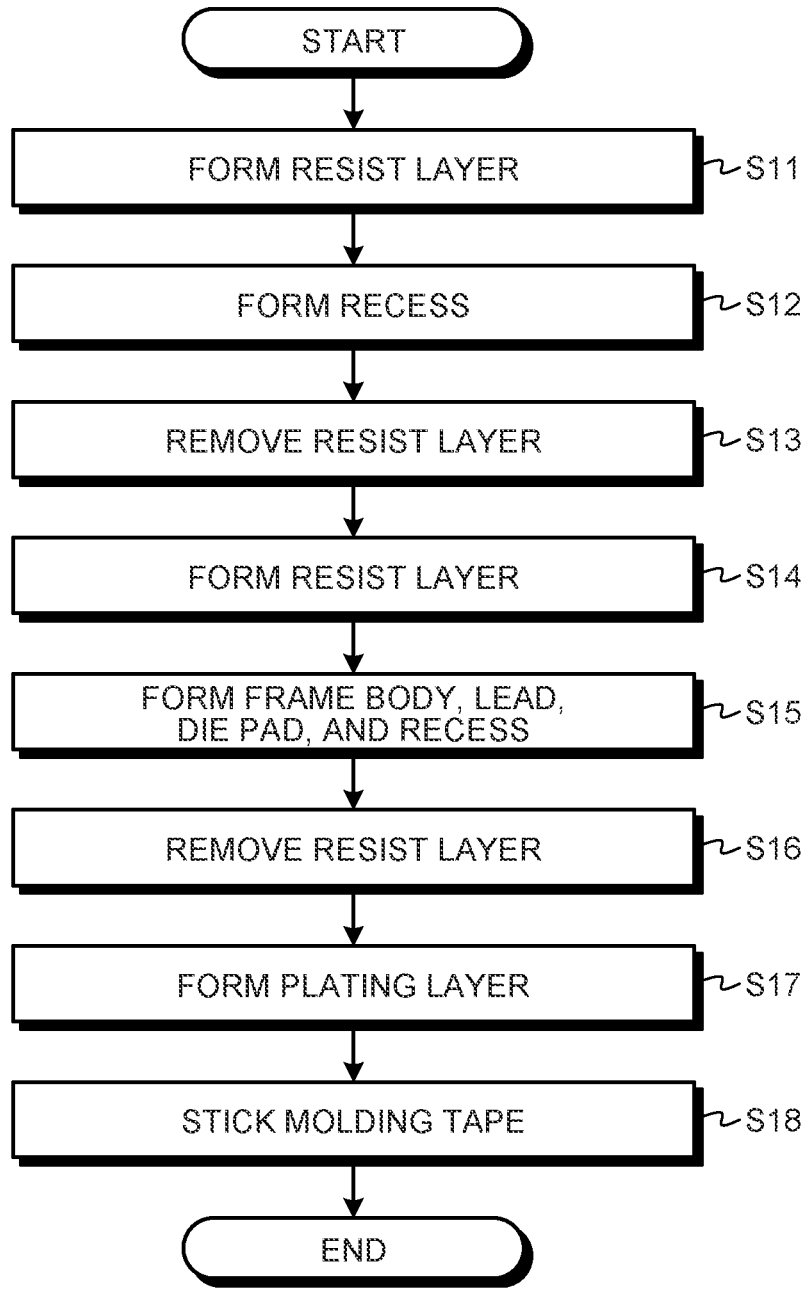
FIG. 12 is a flowchart illustrating an example of a method for manufacturing a lead frame according to the embodiment.

Next, a method for manufacturing the lead frame 100 according to the embodiment will be described. FIG. 12 is a flowchart illustrating an example of the method for manufacturing the lead frame 100 according to the embodiment.

Figure 13:
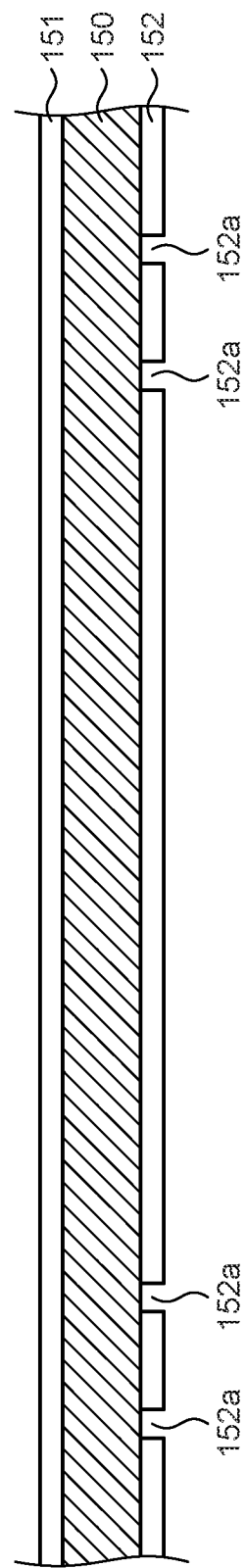
FIG. 13 is a view for explaining a resist layer formation step.

For example, a metal plate made of copper or copper alloy can be used for manufacturing the lead frame 100. Areas where the recesses 110 are to be formed (hereinafter referred to as a "recess scheduled area") is provided on a lower surface of the metal plate. First, a resist layer having a predetermined pattern is formed on the metal plate having the recess scheduled areas (step S11). That is, as illustrated in, for example, FIG. 13, a resist layer 151 with no opening is formed on an upper surface of a metal plate 150. A resist layer 152 having openings 152a at the position of each recess scheduled area is also formed on a lower surface of the metal plate 150. FIG. 13 is a view for explaining the resist layer formation step. The resist layers 151 and 152 are formed by laminating, for example, photosensitive dry films on the upper and lower surfaces of the metal plate 150 and patterning the dry films by photolithography.

Figure 14:
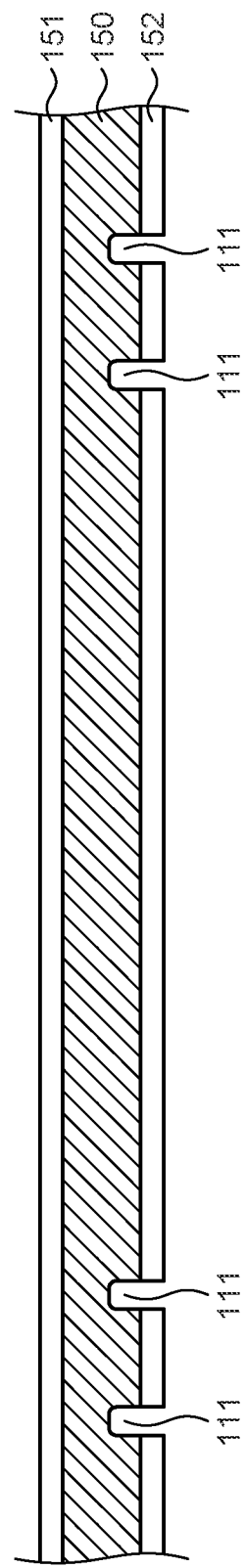
FIG. 14 is a view for explaining a recess formation step.

After the resist layers 151 and 152 are formed, the recesses 111 are formed in each recess scheduled area of the lower surface of the metal plate 150 by etching the metal plate 150 using the resist layers 151 and 152 as a mask (step S12). That is, each recess 111 is formed at the position of the corresponding opening 152a of the resist layer 152 as illustrated in, for example, FIG. 14. FIG. 14 is a view for explaining the recess formation step. The metal plate 150 is etched by using, for example, an etchant. An appropriate etchant can be selected according to the material of the used metal plate 150. For example, when copper is used as the metal plate 150, a ferric chloride aqueous solution or a cupric chloride aqueous solution is used. The metal plate 150 is etched by, for example, spraying the etchant onto the upper and lower surfaces of the metal plate 150. The recesses 111 are thereby formed in each recess scheduled area of the metal plate 150. When the recesses 111 are formed in each recess scheduled area of the metal plate 150, the recesses 111 have a smaller depth than a target depth. The target depth is, for example, a value larger than the half of the thickness of the lead 102.

Figure 15:
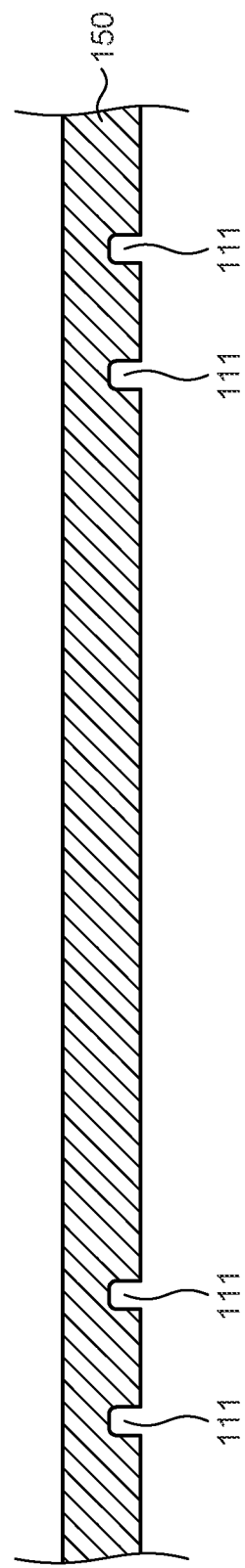
FIG. 15 is a view for explaining a resist layer removal step.

After the recesses 111 are formed in the metal plate 150, the resist layers 151 and 152 are removed (step S13). That is, the resist layers 151 and 152 are removed from the metal plate 150 using, for example, an alkaline stripping solution as illustrated in, for example, FIG. 15. FIG. 15 is a view for explaining the resist layer removal step.

Figure 16:
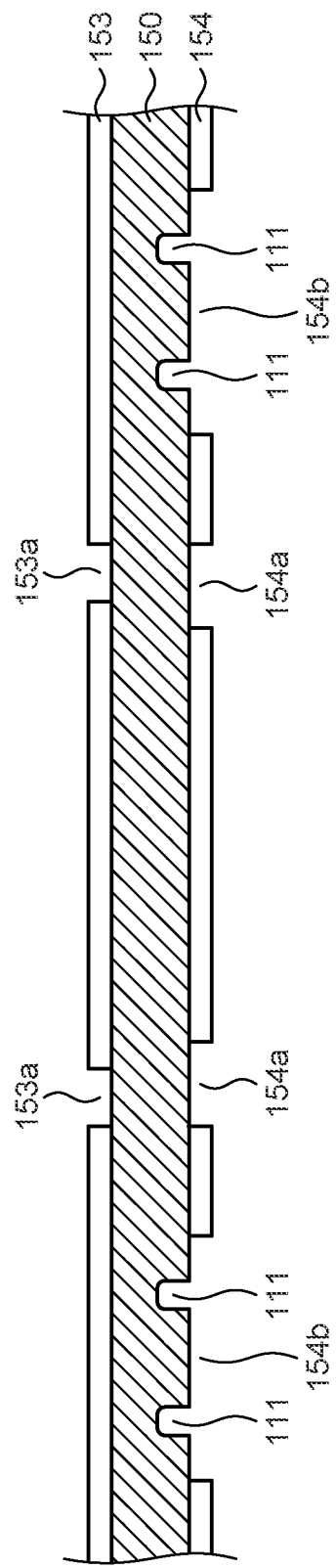
FIG. 16 is a view for explaining a resist layer formation step.

After the resist layers 151 and 152 are removed, a resist layer having a predetermined pattern is formed on the metal plate 150 (step S14). That is, as illustrated in, for example, FIG. 16, a resist layer 153 having openings 153a at penetration scheduled positions is formed on the upper surface of the metal plate 150. A resist layer 154 having openings 154a at the penetration scheduled positions and openings 154b at the positions of the recess scheduled areas is also formed on the lower surface of the metal plate 150. FIG. 16 is a view for explaining the resist layer formation step. The resist layers 153 and 154 are formed by laminating, for example, photosensitive dry films on the upper and lower surfaces of the metal plate 150 and patterning the dry films by photolithography. Each opening 154b is formed so as to overlap the recesses 111 in the corresponding recess scheduled area as viewed from the lower surface.

Figure 17:
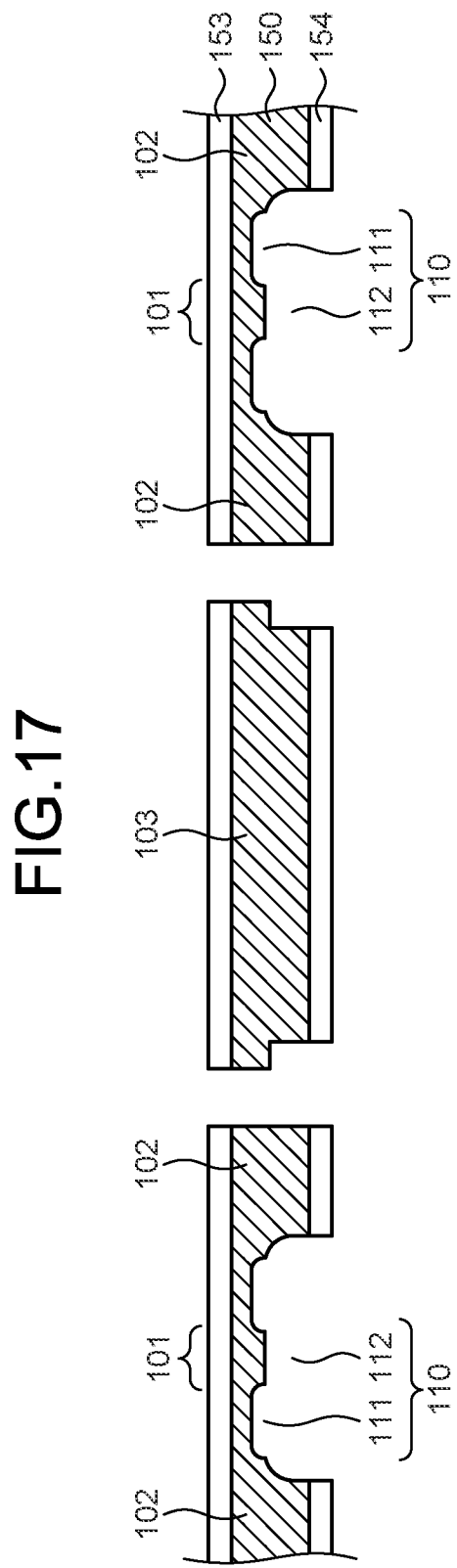
FIG. 17 is a view for explaining a step of forming a frame body, a lead, a die pad, and a recess.

After the resist layers 153 and 154 are formed, the frame body 101, the leads 102, the die pad 103, and the recesses 110 are formed by further etching the metal plate 150 using the resist layers 153 and 154 as a mask (step S15). That is, the frame body 101, the leads 102, and the die pad 103 are formed from the metal plate 150 by penetrating the positions of the openings 153a and 154a by etching as illustrated in, for example, FIG. 17. At this time, the lower surfaces of the adjacent leads 102 with the frame body 101 therebetween is half-etched at the position of each opening 154b overlapping the recesses 111. This reduces the thickness of the leads 102 around the recesses 111, and further reduces the thickness of the leads 102 at the positions of the recesses 111. As a result, each recess 110 having the two-stage recesses 111 and 112 is formed across the lower surfaces of the adjacent leads 102 with the frame body 101 therebetween. FIG. 17 is a view for explaining the step of forming the frame body, the leads, the die pad, and the recesses. Additionally, in further etching the metal plate 150, the lower surface of the frame body 101 and the bottom surface of the recess 112 are formed simultaneously at positions recessed in the thickness direction of the leads 102 from the lower surfaces of the leads 102. In other words, the frame body 101 has the lower surface formed at a lower position in the thickness direction of the leads 102 than the lower surfaces of the leads 102, and the bottom surface of the recess 112 is located flush with the lower surface of the frame body 101. The metal plate 150 is etched by using, for example, an etchant. An appropriate etchant can be selected according to the material of the used metal plate 150. For example, when copper is used as the metal plate 150, a ferric chloride aqueous solution or a cupric chloride aqueous solution is used. The metal plate 150 is etched by, for example, spraying the etchant onto the upper and lower surfaces of the metal plate 150. Consequently, the frame body 101, the leads 102, and the die pad 103 are formed from the metal plate 150, and each recess 110 having the recesses 111 and 112 is formed across the lower surfaces of the adjacent leads 102 with the frame body 101 therebetween. When each recess 110 is formed in the lower surfaces of the adjacent leads 102 with the frame body 101 therebetween, the depth of the recesses 111 reaches the target depth. At this time, the depth of the recesses 111 is larger than the half of the thickness of the leads 102, and the depth of the recess 112 is smaller than the half of the thickness of the leads 102. Thus, even when the saw debris generated during cutting the cut range including the frame body 101 by the saw blade adheres to the recesses 111, the solder wet-spreading in each recess 110 is not restricted by the saw debris. Meanwhile, the relatively shallow recess 112 mitigates the decrease in the entire thickness of the leads 102, ensuring the strength of the leads 102 at each recess 110.

Figure 18:
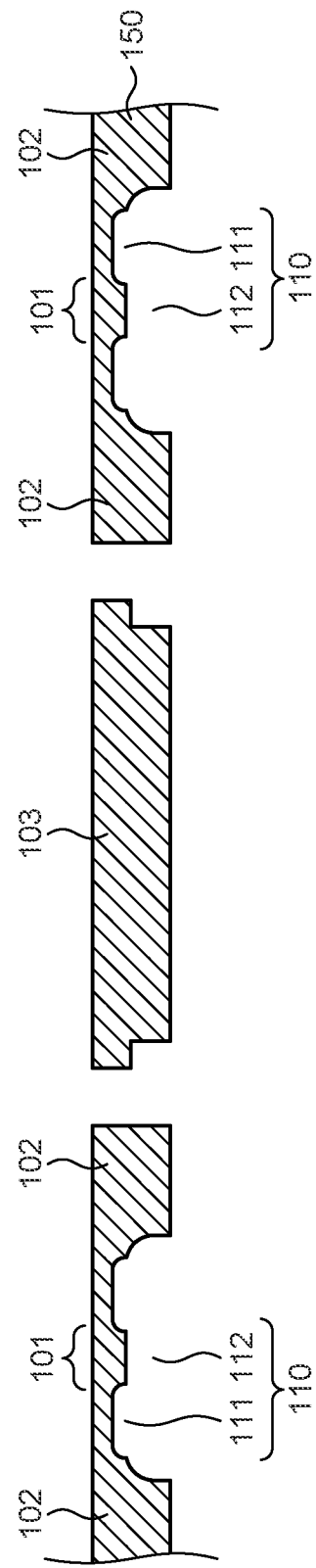
FIG. 18 is a view for explaining a resist layer removal step.

After the frame body 101, the leads 102, the die pad 103, and the recesses 110 are formed, the resist layers 153 and 154 are removed (step S16). That is, the resist layers 153 and 154 are removed from the metal plate 150 using, for example, an alkaline stripping solution as illustrated in, for example, FIG. 18. FIG. 18 is a view for explaining the resist layer removal step.

Figure 19:
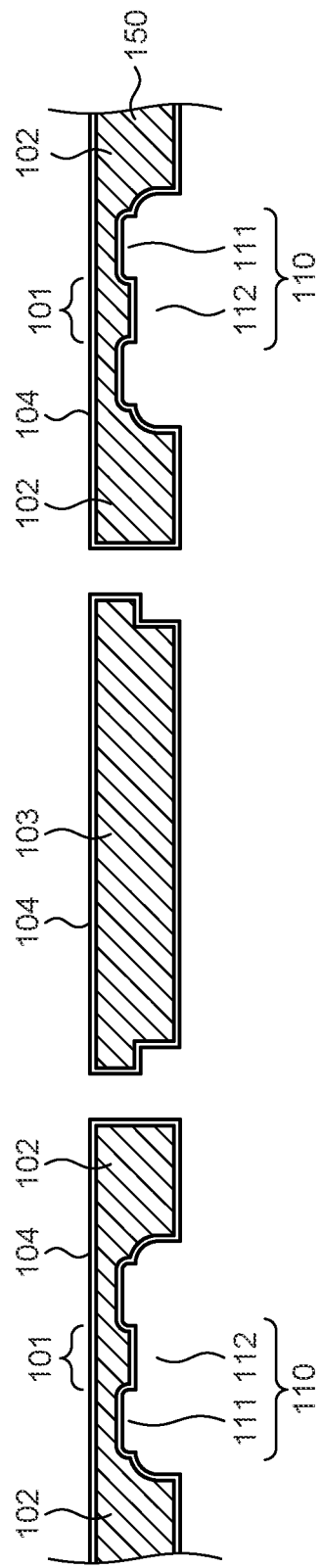
FIG. 19 is a view for explaining a plating layer formation step.

After the resist layers 153 and 154 are removed, the plating layer 104 is formed by an electroplating or electroless plating method (step S17). That is, the plating layer 104 is formed on the surface of the lead frame 100 (i.e., the surfaces of the frame body 101, the leads 102, and the die pad 103) by the electroplating or electroless plating method as illustrated in, for example, FIG. 19. The plating layer 104 is also formed inside of the recesses 110. FIG. 19 is a view for explaining the plating layer formation step.

Figure 20:
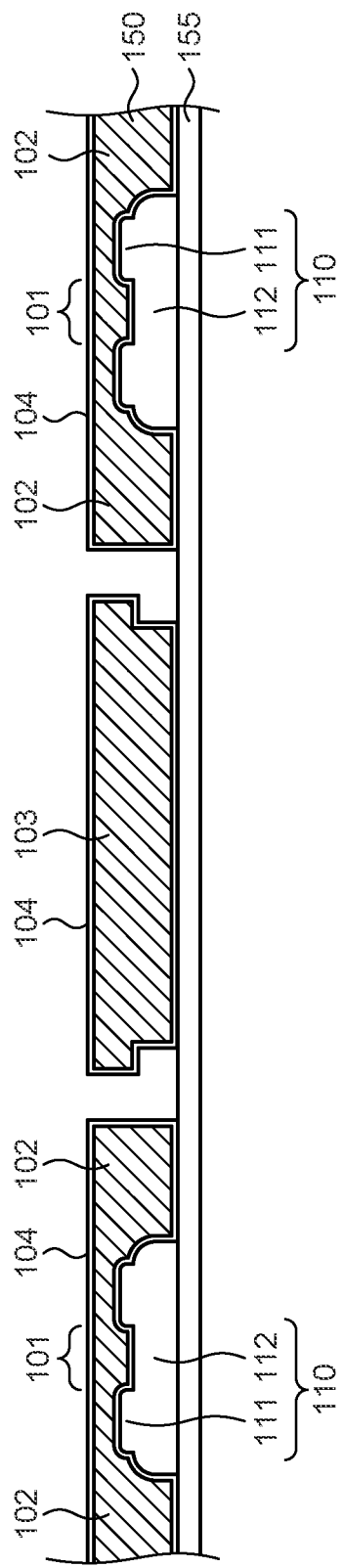
FIG. 20 is a view for explaining a molding tape sticking step.

A molding tape 155 is then stuck on the lower surface of the lead frame 100 (step S18). That is, the molding tape 155 is stuck on the lower surface of the lead frame 100, so as to cover the lower surfaces of the leads 102 and the die pad 103 as illustrated in, for example, FIG. 20. FIG. 20 is a view for explaining the molding tape sticking step. The recesses 110 are closed by covering the lower surfaces of the leads 102 with the molding tape 155.

Through the above steps, the lead frame 100 is obtained. Note that the molding tape sticking step may be omitted according to the need. In this case, the molding tape 155 may be stuck on the lower surface of the lead frame 100 when the semiconductor package 200 is manufactured by using the lead frame 100.

Method for Manufacturing Semiconductor Package

Figure 21:
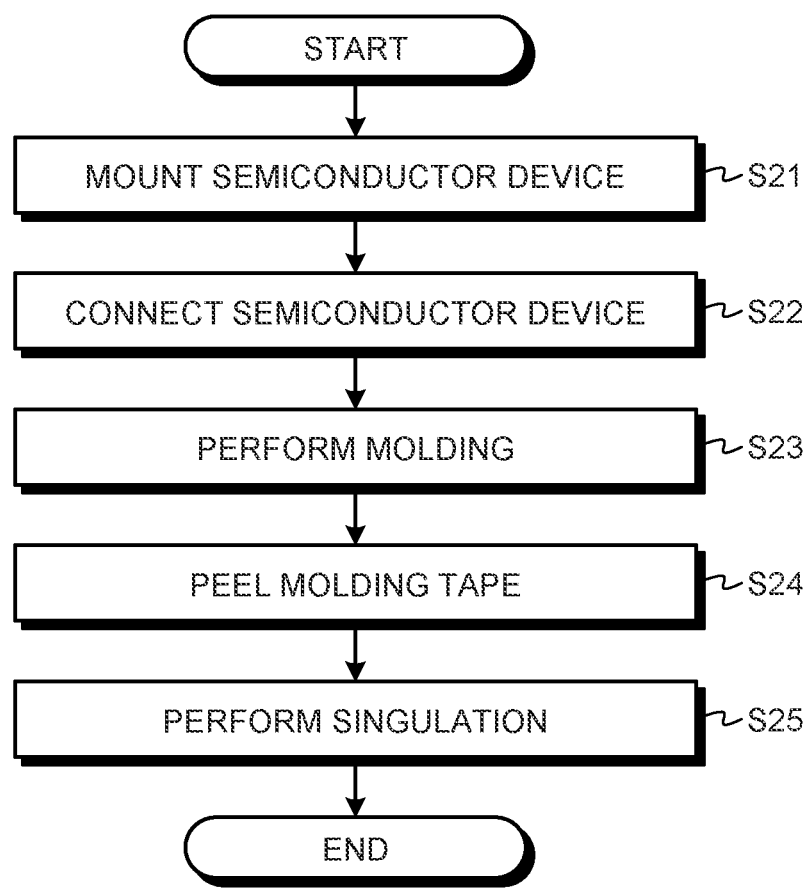
FIG. 21 is a flowchart illustrating an example of a method for manufacturing a semiconductor package according to the embodiment.

Next, a method for manufacturing the semiconductor package 200 according to the embodiment will be described. FIG. 21 is a flowchart illustrating an example of the method for manufacturing the semiconductor package 200 according to the embodiment. The semiconductor package 200 is manufactured by using the above-described lead frame 100.

Figure 22:
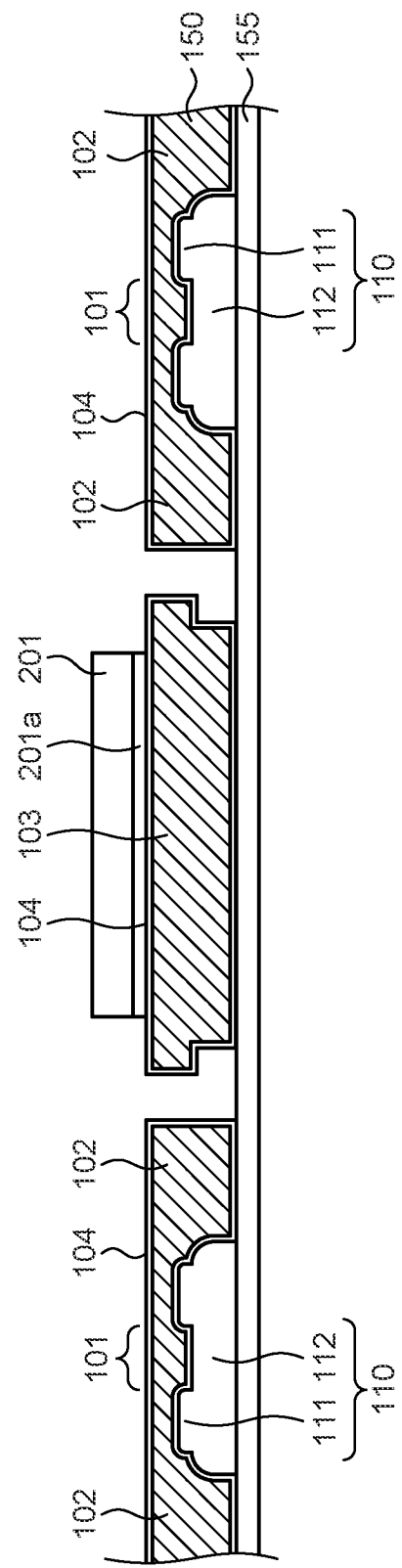
FIG. 22 is a view for explaining a semiconductor device mounting step.

First, the semiconductor device 201 is mounted on the upper surface of the die pad 103 of the lead frame 100 (step S21). That is, the semiconductor device 201 is bonded to the upper surface of the die pad 103 by the adhesive 201a, so as to be mounted on the upper surface of the die pad 103 as illustrated in, for example, FIG. 22. FIG. 22 is a view for explaining the semiconductor device mounting step.

Figure 23:
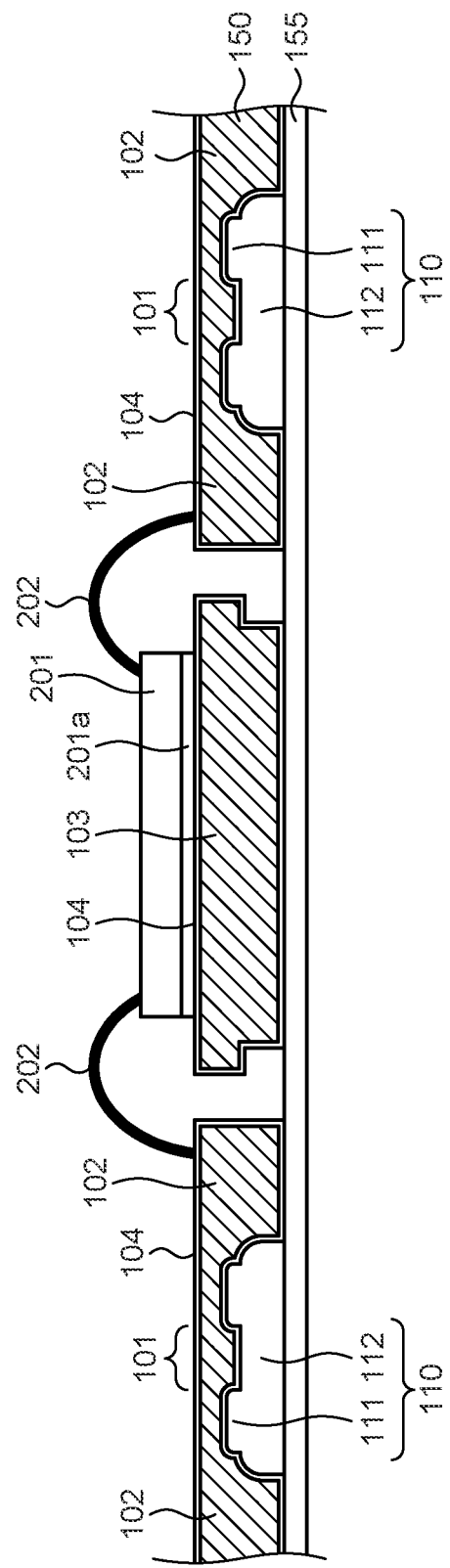
FIG. 23 is a view for explaining a semiconductor device connection step.

Subsequently, the semiconductor device 201 on the upper surface of the die pad 103 is connected to the leads 102 by, for example, wire bonding (step S22). That is, electrodes of the semiconductor device 201 are connected to the upper surfaces of the leads 102 via the connection members 202 such as bonding wires as illustrated in, for example, FIG. 23. FIG. 23 is a view for explaining the semiconductor device connection step.

Figure 24:
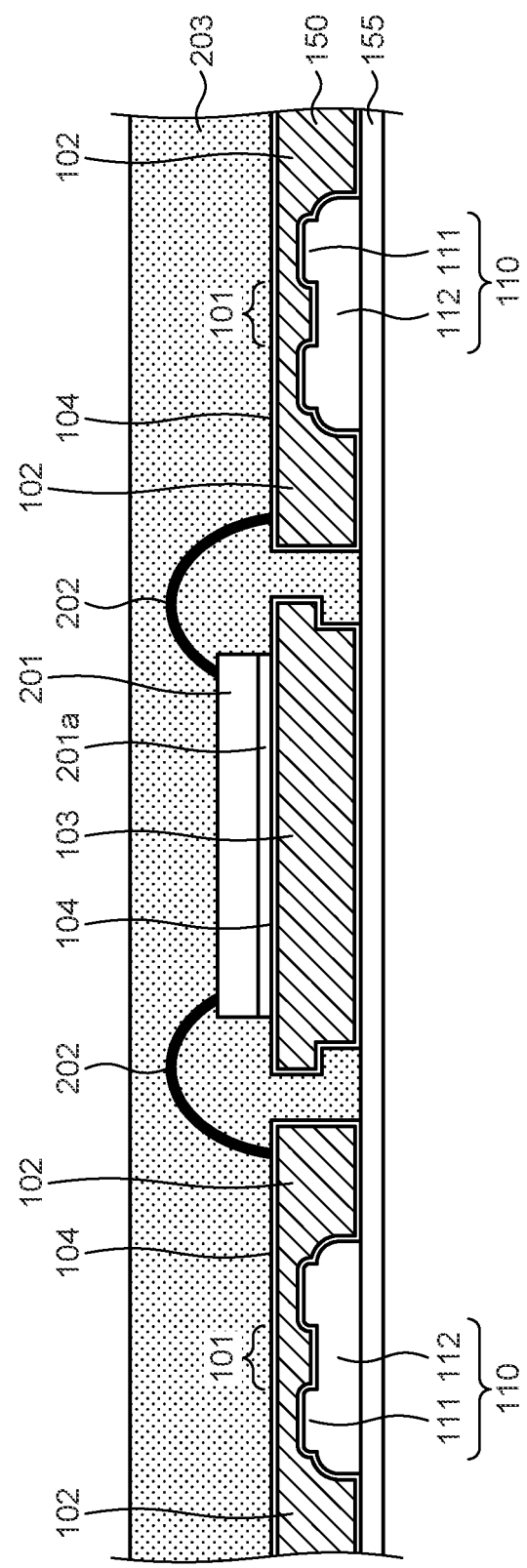
FIG. 24 is a view for explaining a molding step.

Portions of the leads 102 and the die pad 103, the connection members 202, and the semiconductor device 201 on the upper surface of the die pad 103 are then encapsulated by the encapsulating resin 203 by performing, for example, transfer molding (step S23). For example, an insulating resin such as an epoxy resin and a silicone resin can be used as the encapsulating resin 203. In the transfer molding, a structural body including the semiconductor device 201 mounted on the upper surface of the die pad 103 and the lead frame 100 is housed in a mold, and the uncured encapsulating resin 203 is injected into the mold. The encapsulating resin 203 is then heated to a predetermined temperature to be cured. The encapsulating resin 203 thereby covers the upper surfaces of the leads 102 and the die pad 103, the connection members 202, and the semiconductor device 201 to encapsulate the portions of the leads 102 and the die pad 103, the connection members 202, and the semiconductor device 201 as illustrated in, for example, FIG. 24. Since the lower surfaces of the leads 102 are covered with the molding tape 155, the recesses 110 in the lower surfaces of the leads 102 are not filled with the encapsulating resin 203. FIG. 24 is a view for explaining the molding step.

Figure 25:
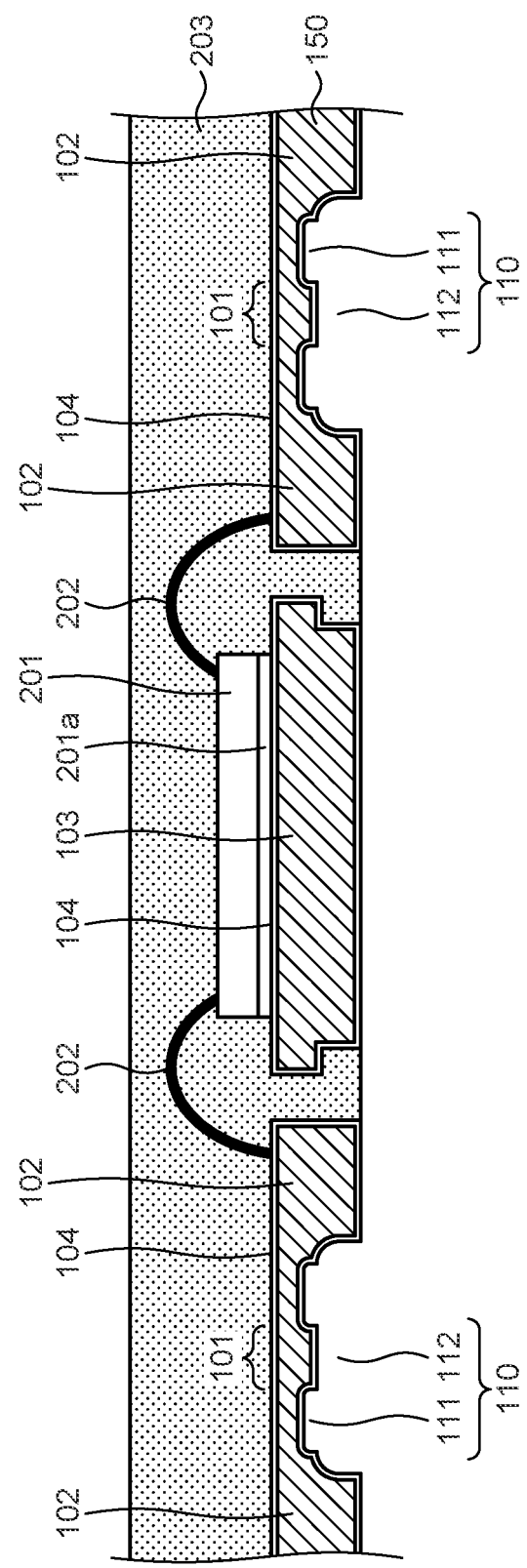
FIG. 25 is a view for explaining a molding tape peeling step.

After the portions of the leads 102 and the die pad 103, the connection members 202, and the semiconductor device 201 are encapsulated, the molding tape 155 is peeled from the lower surface of the lead frame 100 (step S24). That is, the molding tape 155 is peeled from the lower surface of the lead frame 100, exposing the lower surfaces of the leads 102 and the die pad 103 from the encapsulating resin 203 as illustrated in, for example, FIG. 25. FIG. 25 is a view for explaining the molding tape peeling step. The recesses 110 are opened by exposing the lower surfaces of the leads 102 from the encapsulating resin 203.

Figure 26:
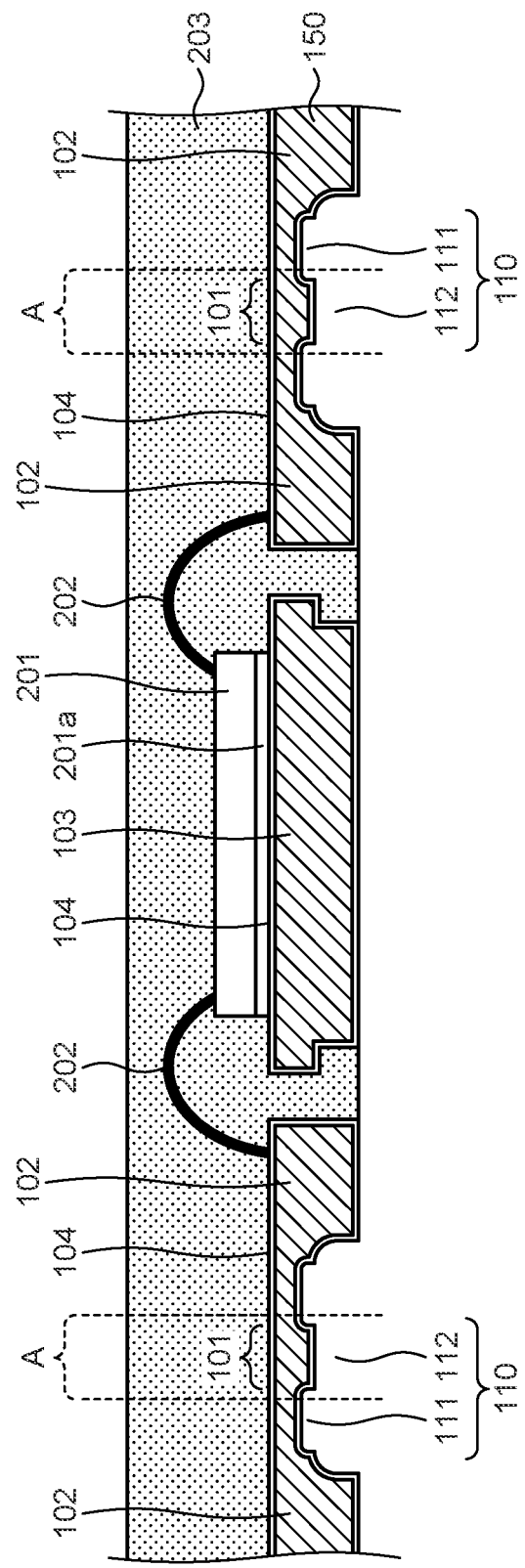
FIG. 26 is a view for explaining a singulation step.

Through the above steps, a structural body having a structure similar to the semiconductor package 200 is obtained as illustrated in, for example, FIG. 26. The structural body is configured as an aggregate in which the single lead frame 100 is disposed in each of a plurality of sections divided in a matrix. Thus, singulation for cutting out the single lead frame 100 is performed (step S25). That is, the semiconductor package 200 is obtained by sawing the structural body in FIG. 26 by a saw blade capable of cutting a cut range A including the frame body 101. FIG. 26 is a view for explaining the singulation step. Since the cut range A overlaps a center portion of each recess 110 (i.e., a portion of the pair of recesses 111 close to the frame body 101), opposite ends of each recess 110 are left at the side ends of the lower surfaces of the leads 102. The remaining two-stage recesses 111 and 112 of each recess 110 are open at the side surface 102b of the corresponding lead 102 exposed from the encapsulating resin 203. The two steps are thereby formed by the two-stage recesses 111 and 112 at the side end of the lower surface 102a of each lead 102.

Figure 27:
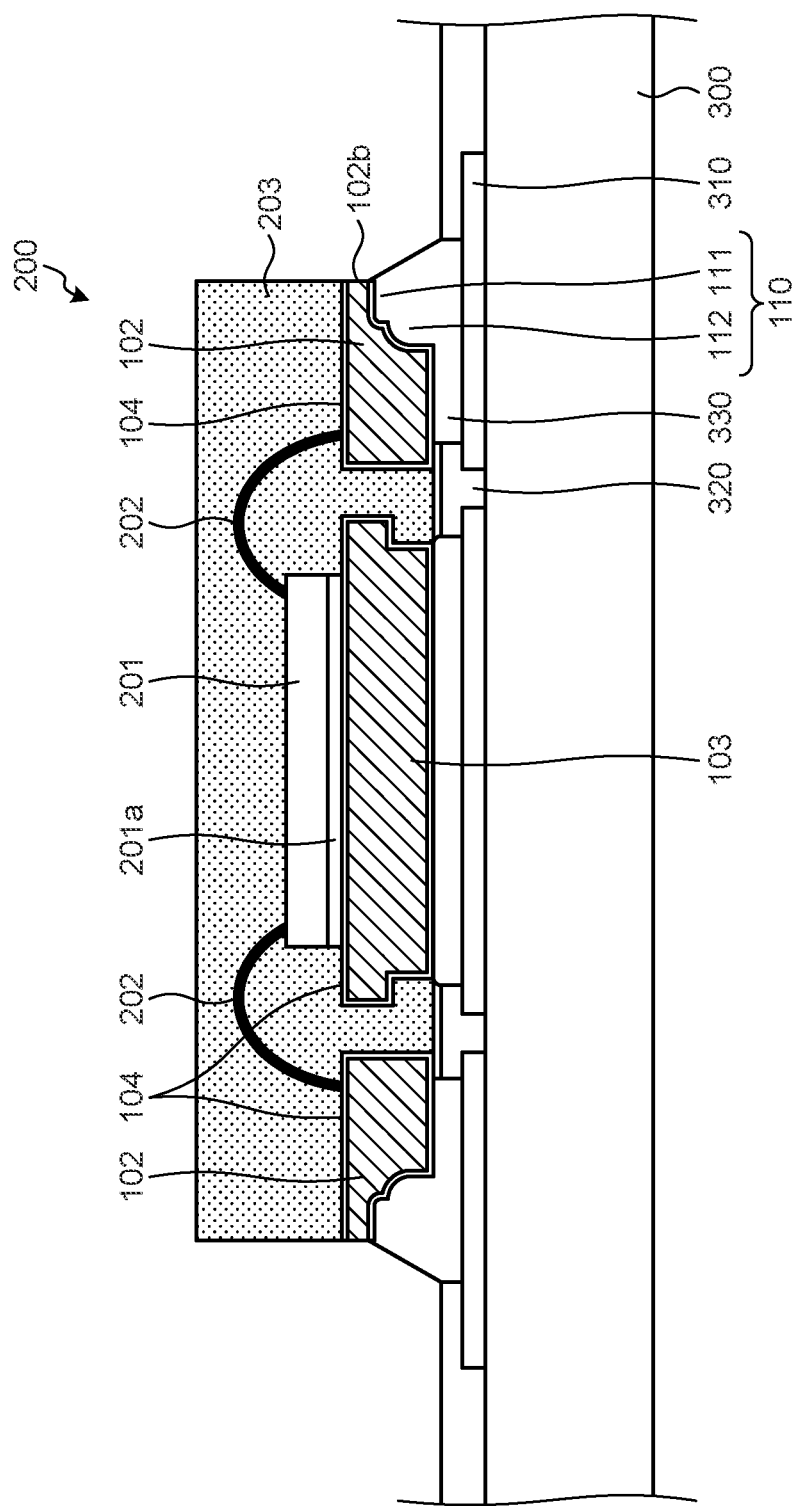
FIG. 27 is a view for explaining mounting of the semiconductor package.

The semiconductor package 200 obtained by the singulation can be mounted on a mounting substrate. To be more specific, the semiconductor package 200 can be mounted on the mounting substrate using the leads 102 as the terminals. FIG. 27 is a view for explaining the mounting of the semiconductor package 200.

As illustrated in FIG. 27, pads 310 are formed on a wiring layer on an upper surface of a mounting substrate 300. The pads 310 are exposed from openings of a solder resist layer 320. To mount the semiconductor package 200 on the mounting substrate 300, positioning between the leads 102 and the die pad 103 of the semiconductor package 200 and the pads 310 of the mounting substrate 300 is performed. The leads 102 and the die pad 103 are bonded to the pads 310 by solder 330. Since the side end of the lower surface of each lead 102 has the two steps by the two-stage recesses 111 and 112, the wet-spreading of the solder 330 is facilitated in each recess 110, and a fillet of the solder 330 covers the side surface 102b of each lead 102. As a result, the semiconductor package 200 is firmly bonded to the mounting substrate 300. This improves connection reliability. This also improves visibility of the solder 330 by the fillet. That is, quality determination of the bonding between the semiconductor package 200 and the mounting substrate 300 is facilitated. Moreover, in the state in FIG. 27, the relatively shallow recess 112 mitigates the decrease in the entire thickness of each lead 102, ensuring the strength of each lead 102. As a result, each lead 102 can be prevented from being deformed at the recess 110.

As described above, the lead frame according to the embodiment includes the frame body, the leads, and the recess. The leads individually project from the frame body. The recess is formed across one surfaces of the leads adjacent to each other with the frame body therebetween, and includes the first recess (e.g., the recess 111) and the second recess (e.g., the recess 112) partially overlapping the first recess in the bottom surface of the first recess and having a smaller depth from the one surfaces of the leads than the first recess has. The lead frame according to the embodiment can thereby mitigate the decrease in the entire thickness of the leads at the recess, ensuring the strength of the leads. As a result, the leads can be prevented from being deformed at the recess.

In the lead frame according to the embodiment, the depth of the first recess of the recess from the one surfaces of the leads is larger than the predetermined value determined according to the thickness of the leads. The depth of the second recess of the recess from the one surfaces of the leads is smaller than the predetermined value. Thus, the locally deep first recess can improve solder wettability with respect to the leads, and the relatively shallow second recess can ensure the strength of the leads.

In the lead frame according to the embodiment, the recess includes the pair of first recesses. The paired first recesses are arranged separately from each other within the range having at least the frame body therebetween in the one surfaces of the leads. Thus, the locally deep first recesses can be separated within the range having the frame body therebetween. This ensures the strength of the leads around the frame body.

In the lead frame according to the embodiment, the frame body has the surface formed at a lower position in the thickness direction of the leads than the one surfaces of the leads. The bottom surface of the second recess of the recess is located flush with the surface of the frame body. Thus, the thickness of the frame body can be ensured by adjusting the position of the bottom surface of the relatively shallow second recess. This prevents deformation of the frame body and deformation of the leads at the recess.

The semiconductor package according to the embodiment includes the lead, the semiconductor device connected to the lead via the connection member, and the encapsulating resin covering a portion of the lead, the connection member, and the semiconductor device. The lead includes the first surface (e.g., the upper surface), the second surface (e.g., the lower surface), the side surface, and the recess. The first surface is connected to the connection member and covered with the encapsulating resin. The second surface is located on the opposite side from the first surface and exposed from the encapsulating resin. The side surface continues from the first and second surfaces and is at least partially exposed from the encapsulating resin. The recess is formed at the end on the side surface side of the second surface, and includes the first recess (e.g., the recess 111) and the second recess (e.g., the recess 112) partially overlapping the first recess in the bottom surface of the first recess and having a smaller depth from the second surface than the first recess. The semiconductor package according to the embodiment is thereby firmly bonded to the mounting substrate when mounted on the mounting substrate by soldering. As a result, the connection reliability of the semiconductor package, and the solder visibility by the fillet can be improved. Moreover, the relatively shallow recess 112 can mitigate the decrease in the entire thickness of the lead, preventing deformation of the lead at the recess.

Figure 28:
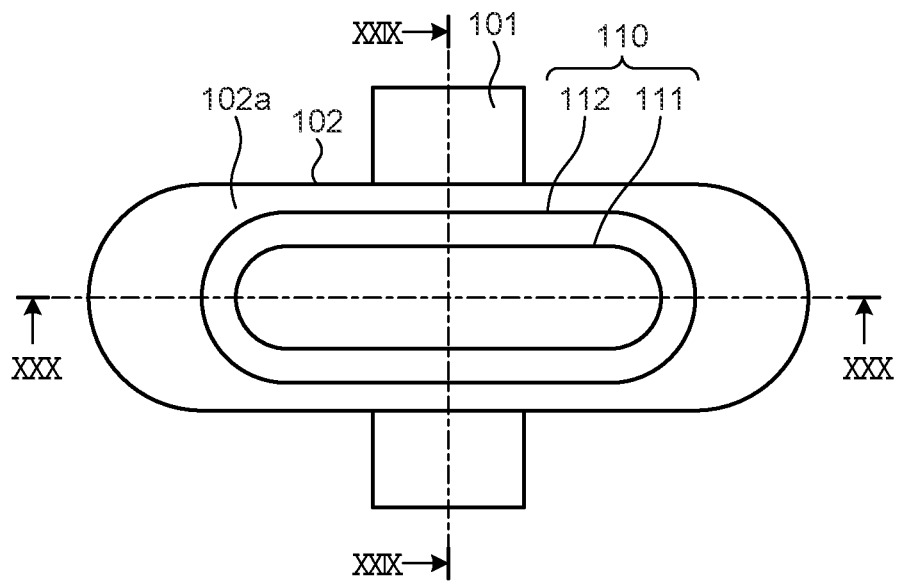
FIG. 28 is a view illustrating a shape example of the recess.
Figure 29:
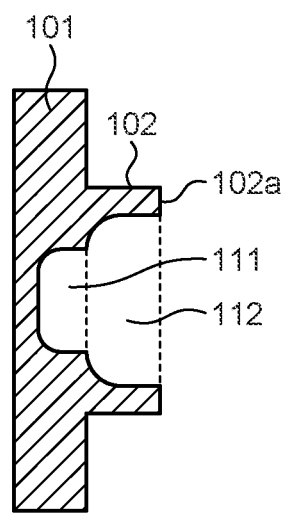
FIG. 29 is a cross sectional view taken along a line XXIX-XXIX in FIG. 28.
Figure 30:
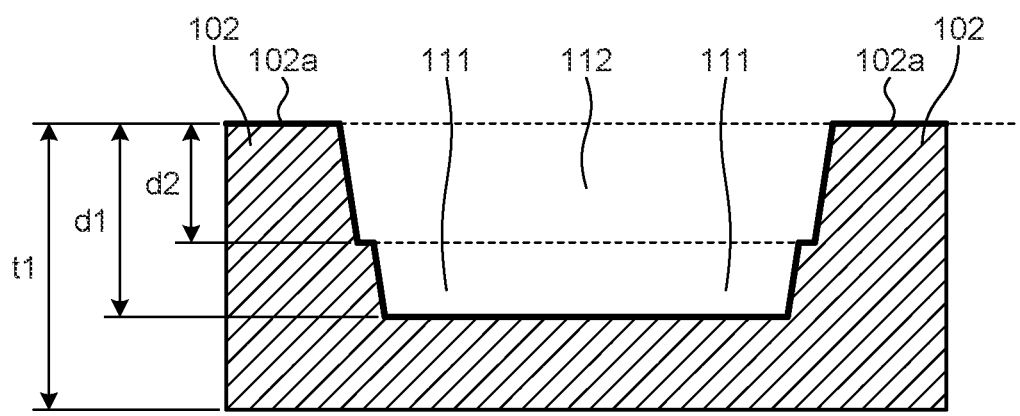
FIG. 30 is a cross sectional view taken along a line XXX-XXX in FIG. 28.

In the lead frame 100 according to the above embodiment, the example in which the pair of recesses 111 of the recess 110 is arranged separately from each other within the range having at least the frame body 101 therebetween in the lower surfaces 102a of the leads 102 has been described. Alternatively, the integrated recess 111 of the recess 110 may be formed. In this case, the recess 111 of the recess 110 extends in the longitudinal direction of the leads 102 across the frame body 101 in the lower surfaces 102a of the leads 102 as illustrated in, for example, FIGS. 28 to 30. FIG. 28 is a view illustrating a shape example of the recess 110. FIG. 28 illustrates the lower surfaces 102a of the adjacent leads 102 with the frame body 101 therebetween in an enlarged manner. FIG. 29 is a cross sectional view taken along a line XXIX-XXIX in FIG. 28. FIG. 30 is a cross sectional view taken along a line XXX-XXX in FIG. 28. Since the recess 111 of the recess 110 extends across the frame body 101, a metal amount around the frame body 101 is reduced. As a result, the saw debris generated from the frame body 101 in sawing the cut range including the frame body 101 can be reduced. This improves workability of the lead frame 100.

Figure 31:
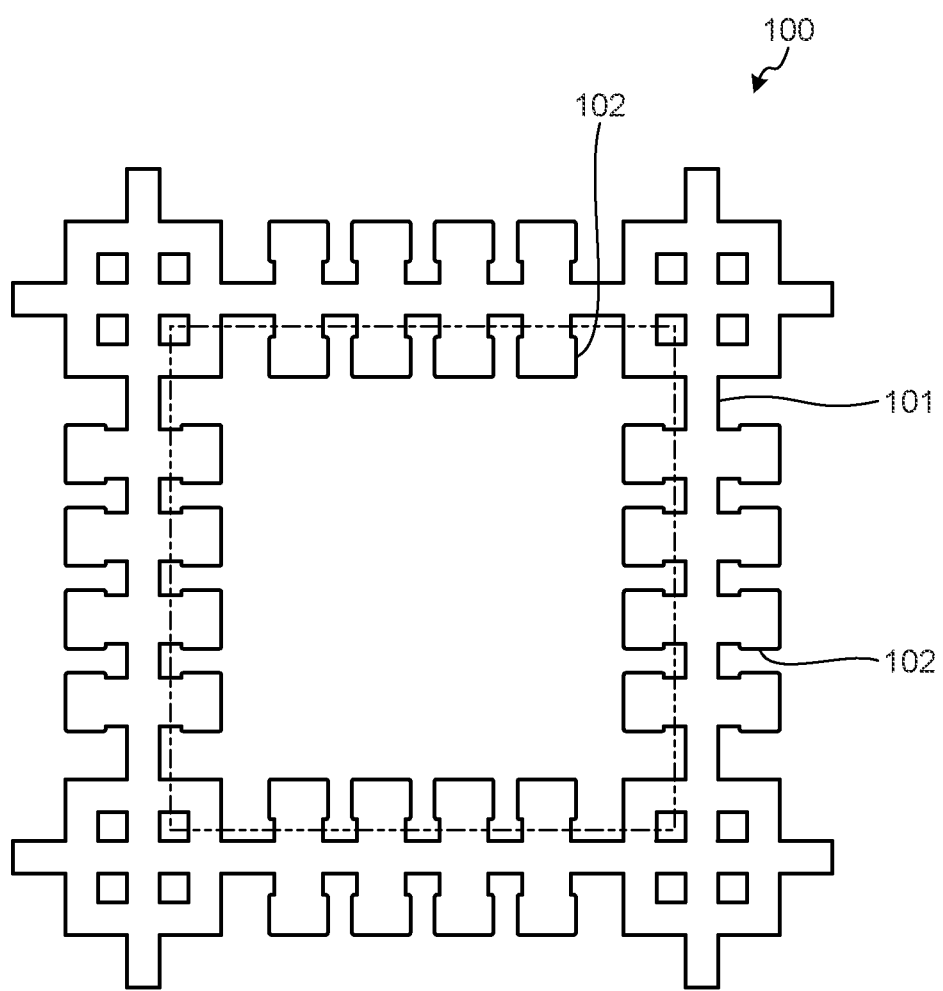
FIG. 31 is a plan view of a lead frame according to a modification as viewed from its upper surface.
Figure 32:
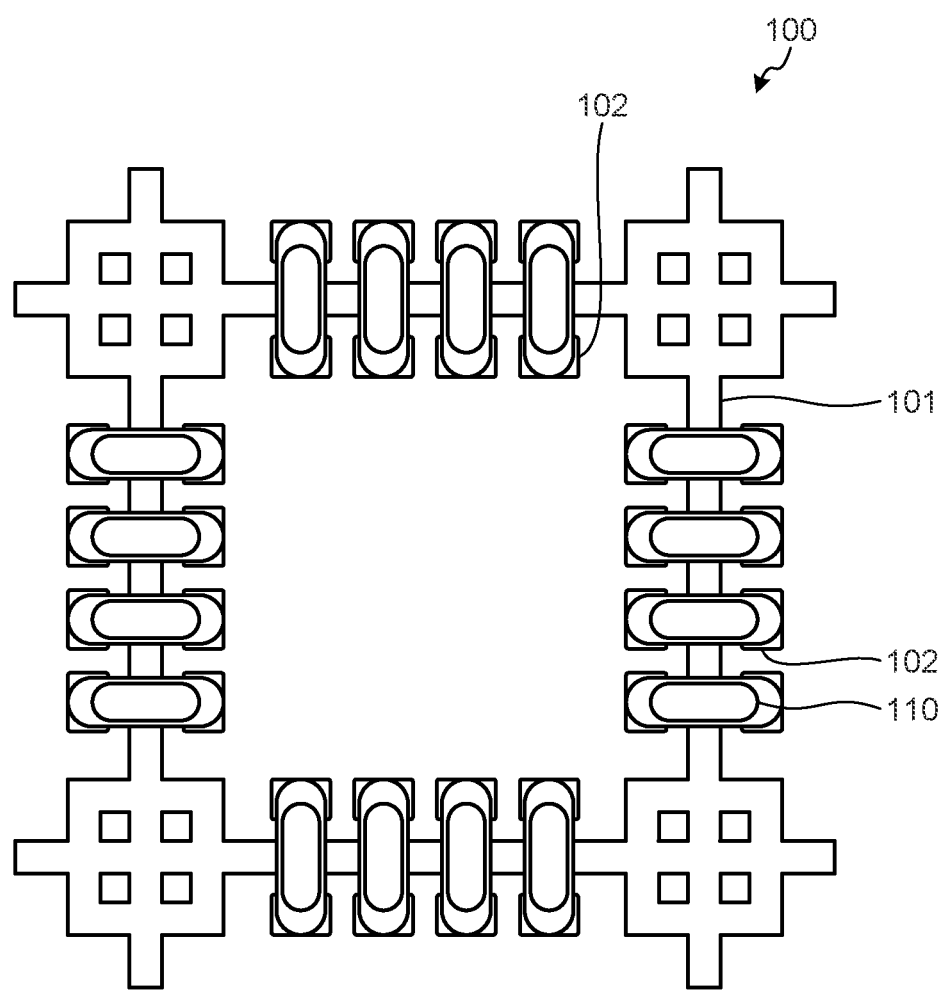
FIG. 32 is a plan view of the lead frame according to the modification as viewed from its lower surface.

Additionally, in the lead frame 100 according to the above embodiment, the example in which the mounting surface for mounting the semiconductor device thereon is formed on the upper surface of the die pad 103 has been described. Alternatively, the die pad 103 may be omitted when the semiconductor device can be mounted on the upper surfaces of the leads 102. That is, the lead frame 100 according to a modification does not include the die pad 103, and the upper surfaces of the leads 102 are used as the mounting surface for mounting the semiconductor device thereon as illustrated in, for example, FIGS. 31 and 32. FIG. 31 is a plan view of the lead frame 100 according to the modification as viewed from its upper surface. FIG. 32 is a plan view of the lead frame 100 according to the modification as viewed from its lower surface.

Figure 33:
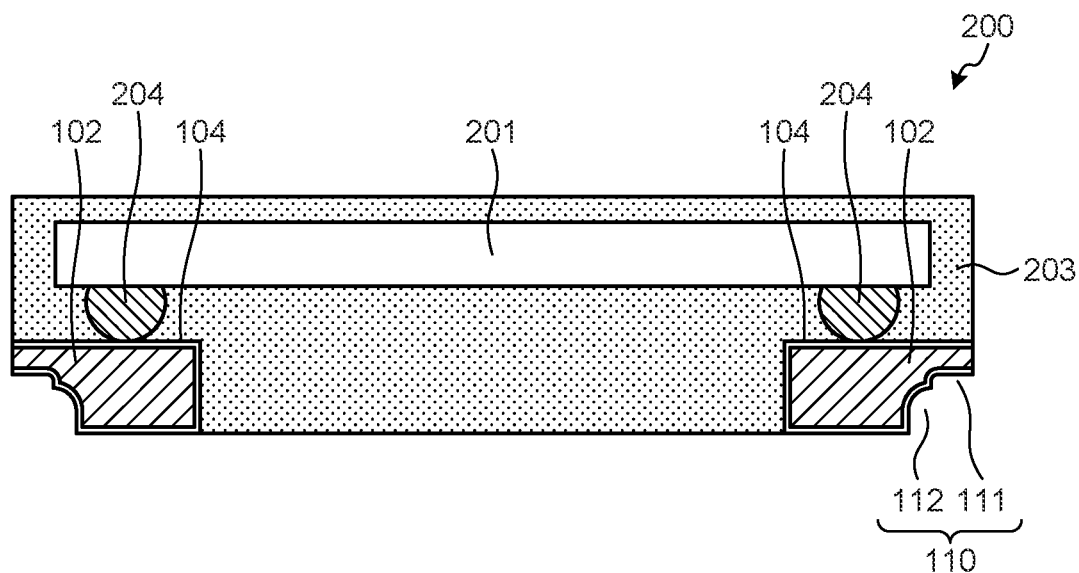
FIG. 33 is a view illustrating a configuration of a semiconductor package manufactured by using the lead frame according to the modification.

FIG. 33 illustrates a configuration of the semiconductor package 200 manufactured by using the lead frame 100 according to the modification. FIG. 33 illustrates a cross section of the semiconductor package 200 at a position corresponding to the cross section taken along the line IX-IX in FIG. 8. In the semiconductor package 200 in FIG. 33, the upper surfaces of the leads 102 are used as the mounting surface for mounting the semiconductor device 201 thereon. The electrodes of the semiconductor device 201 are flip-chip connected to the upper surfaces of the leads 102 by solder bumps 204 as an example of the connection members.

Figure 34:
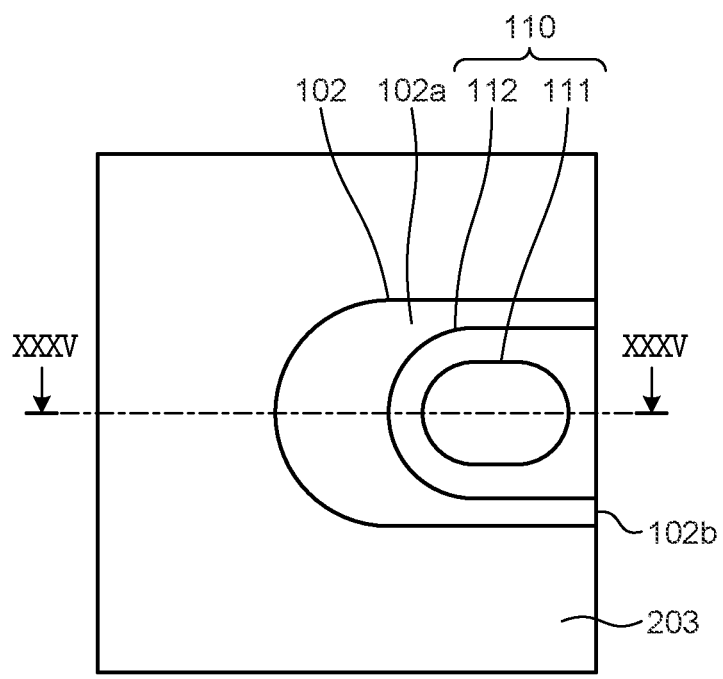
FIG. 34 is a view illustrating a shape example of the recess in the semiconductor package.
Figure 35:
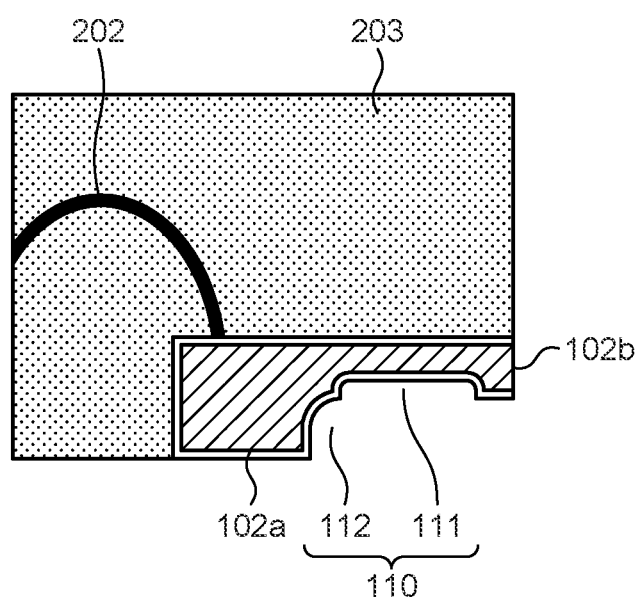
FIG. 35 is a cross sectional view taken along a line XXXV-XXXV in FIG. 34.

Moreover, in the semiconductor package 200 manufactured by using the lead frame 100 according to the above embodiment, the example in which the two-stage recesses 111 and 112 of the recess 110 are open at the side surface 102b of each lead 102 exposed from the encapsulating resin 203 has been described. Alternatively, the recess 111 of the recess 110 does not need to reach the side surface 102b of each lead 102 exposed from the encapsulating resin 203. That is, the recess 112 of the recess 110 may be open at the side surface 102b of the lead 102, and the recess 111 of the recess 110 may be included in the bottom surface of the recess 112 without reaching the side surface 102b of each lead 102 as illustrated in, for example, FIGS. 34 and 35. FIG. 34 is a view illustrating a shape example of the recess 110 in the semiconductor package 200. FIG. 34 illustrates the side end of the lower surface 102a of each lead 102 in an enlarged manner. FIG. 35 is a cross sectional view taken along a line XXXV-XXXV in FIG. 34.

In accordance with one aspect of the lead frame disclosed in the present application, the leads can be prevented from being deformed at the recess.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention have been described in detail, it should be understood that the various changes, substitutions, and alterations could be made hereto without departing from the spirit and scope of the invention.

Note

A method for manufacturing a lead frame, the method comprising:

forming a first recess in a recess scheduled area of a metal plate where a recess is to be formed by etching the metal plate having the recess scheduled area; and forming a frame body and a plurality of leads individually projecting from the frame body, and forming, across one surfaces of the leads adjacent to each other with the frame body therebetween, the recess including the first recess and a second recess partially overlapping the first recess in a bottom surface thereof and having a smaller depth from the one surfaces of the leads than the first recess by further etching the metal plate where the first recess has been formed.

What is claimed is:

1. A lead frame comprising:
   a frame body;
   a plurality of leads individually projecting from the frame body; and
   a recess formed across one surfaces of the leads adjacent to each other with the frame body therebetween, wherein
   the recess includes
     a pair of first recesses separated from each other by the frame body, and
     a second recess partially overlapping the pair of first recesses in a bottom surface thereof and having a smaller depth than the pair of first recesses, and
   in plan view of the lead frame, the pair of first recesses are disposed at a position overlapping the second recess and a whole area of the pair of first recesses is included in an area of the second recess.

2. The lead frame according to claim 1, wherein
   a depth of the pair of first recesses from the one surfaces of the leads is larger than a predetermined value determined according to a thickness of the leads, and
   a depth of the second recess from the one surfaces of the leads is smaller than the predetermined value.

3. The lead frame according to claim 1, wherein
   the pair of first recesses are arranged separately from each other within a range having at least the frame body therebetween in the one surfaces of the leads.

4. The lead frame according to claim 1, wherein
   the frame body has a surface formed at a lower position in a thickness direction of the leads than the one surfaces of the leads, and
   the bottom surface of the second recess is located flush with the surface of the frame body.

5. The lead frame according to claim 1, further comprising a die pad for mounting a semiconductor device thereon.

* * * * *